United States Patent
Shibuya

(12) 
(10) Patent No.: US 6,532,583 B1
(45) Date of Patent: Mar. 11, 2003

(54) GLOBAL ROUTING DETERMINATION METHOD AND STORAGE MEDIUM

(75) Inventor: Toshiyuki Shibuya, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/310,205

(22) Filed: May 12, 1999

(30) Foreign Application Priority Data

Jun. 16, 1998 (JP) .......................................... 10-168570

(51) Int. Cl.$^7$ .............................................. G06F 17/50
(52) U.S. Cl. .............................. 716/13; 716/12; 716/14
(58) Field of Search ............................... 716/13, 12, 14

(56) References Cited

U.S. PATENT DOCUMENTS

| | | | | |
|---|---|---|---|---|
| 4,615,011 A | * | 9/1986 | Linsker ...................... | 364/491 |
| 5,404,313 A | * | 4/1995 | Shiohara et al. ............ | 364/491 |
| 5,583,788 A | * | 12/1996 | Kuribayashi ................ | 364/490 |
| 5,856,927 A | * | 1/1999 | Greidinger et al. ......... | 364/491 |
| 5,926,397 A | * | 7/1999 | Yamanouchi ............... | 364/491 |
| 6,009,248 A | * | 12/1999 | Sato et al. ............. | 395/500.03 |
| 6,175,950 B1 | * | 1/2001 | Scepanovic et al. .......... | 716/13 |
| 6,230,304 B1 | * | 5/2001 | Groeneveld et al. ........... | 716/7 |

FOREIGN PATENT DOCUMENTS

| JP | 4-17354 | 1/1992 |
| JP | 4-282772 | 10/1992 |
| JP | 4-344573 | 12/1992 |
| JP | 5-54100 | 3/1993 |

OTHER PUBLICATIONS

Prasitjutrakul et al, "A Performance–Driven Global Router for Custom LVSI Chip Design," IEEE, Aug. 1992, pp. 1044–1051.*
Prasitjutrakul et al, "A Timing–Driven Global Router for Custom Chip Design," IEEE, Nov. 1990, pp. 48–51.*
Tseng et al, "Timing and Crosstalk Driven Area Routing," Jun. 1998, pp. 378–381.*
Burstein et al., "Hierarchical Wire Routing", IEEE Transactions on Computer–Aided Design, vol. CAD–2, No. 4, Oct. 1983.

* cited by examiner

*Primary Examiner*—Vuthe Siek
(74) *Attorney, Agent, or Firm*—Staas & Halsey LLP

(57) ABSTRACT

A global routing determination method successively divides a region which includes cells forming a circuit into a plurality of blocks, and hierarchically determines a global routing among the cells while arranging the cells in the blocks. The global routing determination method includes the steps of selecting a K-pattern which indicates a position of at least one terminal which is to be coupled by a wiring with respect to a predetermined number of blocks, from a registered K-pattern group, reading Q-patterns which indicate wiring patterns with respect to the selected K-pattern, from a registered Q-pattern group, and determining, as a global routing, a Q-pattern which has a wiring from a source terminal to a target terminal within the selected K-pattern with a signal delay time satisfying a predetermined condition, from among the read Q-patterns, where the predetermined condition places priority on a total wiring length than a density or disorder of wirings among the blocks in which the source terminal and the target terminal exist.

14 Claims, 27 Drawing Sheets

K(1), Q(1,0)

K(3), Q(3,0)

K(0), Q(0,0)

K(2), Q(2,0)

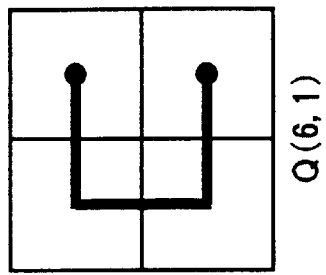
FIG. 8A  K(6)
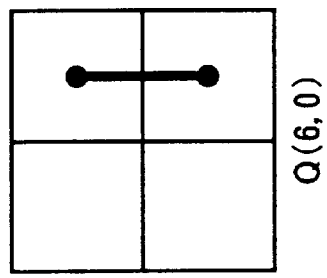
FIG. 8B  Q(6,0)
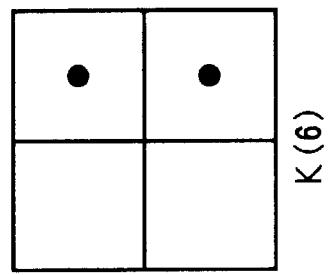
FIG. 8C  Q(6,1)

K(9)

Q(9,0)

Q(9,1)

K(10)

Q(10,0)

Q(10,1)

Q(10,2)

K(11)

Q(11,0)

Q(11,1)

Q(11,2)

K(12)

Q(12,0)

Q(12,1)

Q(12,2)

Q(13,0)

Q(13,2)

K(13)

Q(13,1)

Q(14,1)

Q(14,3)

Q(14,0)

Q(14,2)

K(14)

GLOBAL ROUTING DETERMINATION METHOD AND STORAGE MEDIUM

BACKGROUND OF THE INVENTION

1. Field of the Invention

The present invention generally relates to global routing determination methods and storage mediums, and more particularly to a global routing determination method for determining a global routing of a circuit, and to a computer-readable storage medium which stores a program for causing a computer to determine a global routing of a circuit according to such a global routing determination method.

When designing an integrated circuit such as an LSI circuit by CAD, it is possible to roughly categorize the design stage into a logic design and a physical design. The logic design determines how to realize the logic of the circuit which is to be designed. The physical design determines the arrangement (also referred to as layout or placement) of elements such as cells and gates, wirings and the like which form the circuit, based on the result of the logic design. When making the physical design, the layout of the wirings is basically determined by a global routing and a local (or detailed) routing. The global routing determines the general arrangement of the wirings together with the general arrangement of the elements and the like. On the other hand, the local routing determines the actual detailed arrangement of the wirings depending on the actual arrangement of the elements and the like.

The present invention relates to a global routing method used to make the global routing described above, and also relates to a computer-readable storage medium which stores a program for causing the computer to determine the global routing.

2. Description of the Related Art

Due to the progresses made in the circuit technology, the integration density of the integrated circuit has improved considerably and the circuit scale of the integrated circuit has increased notably in recent years. Conventionally when designing the circuit by CAD, the circuit delay taken into consideration was primarily the delays caused by gates which form the circuit. However, as the integration density of the integrated circuit improved, delays caused by the wirings have increased and are becoming no longer negligible in order to further improve the circuit performance. For this reason, there are demands to realize a method of designing the wirings by taking into consideration the delays caused by the wirings.

Conventionally, as a method of designing the wirings by taking into consideration the delays caused by the wirings, there was a method which determines the wirings so that each wiring length becomes a minimum. However, this conventional method did not accurately consider the delay of the actual wiring from one terminal to another terminal, as explained in the following.

First, a description will be given of the Elmore delay. It is assumed for the sake of convenience that a tree T has a source s0. If an edge from a node v towards the source s0 is denoted by ev, a resistance of the edge ev is denoted by $r_{ev}$, a capacitance of the edge ev is denoted by $C_{ev}$, a subtree of the node v is denoted by Tv, a capacitance of the subtree Tv is denoted by Cv, an ON-resistance of an output driver of the source s0 is denoted by rd, and a sum total of the wiring lengths is denoted by $C_{s0}$, the Elmore delay from the source s0 to the target v can be described by the following formula (1).

$$D(v) = rdC_{s0} + \sum_{ev \in path(s0,v)} r_{ev}(C_{ev}/2 + Cv) \quad (1)$$

In the formula (1), the first term indicates that the delay from the source s0 to the target v becomes shorter as the sum total $C_{s0}$ of the wiring lengths becomes shorter. In addition, in the formula (1), the second term indicates that the delay becomes shorter as the wiring length from the source s0 to the target v becomes shorter, and that the delay becomes shorter as the capacitance Cv of the subtree Tv connected to the target v becomes smaller.

Next, a description will be given of the mechanism by which the wiring delays become different even for the same wiring length. FIGS. 1A and 1B respectively are diagrams showing a case where a region including cells which form a circuit is successively divided into a plurality of blocks, and the global routing among the cells is hierarchically determined while arranging the cells in the blocks. In this particular case, the region is formed by 2×2 blocks, and there exist 3 terminals which are to be connected by the wirings. In FIGS. 1A and 1B, a black circular mark indicates the terminal, and a straight line connecting the terminals indicates the wiring.

In FIGS. 1A and 1B, it is assumed for the sake of convenience that each block has a side with a resistance R, a terminal s0 has an ON-resistance rd, a terminal v1 has a capacitance C1, and a terminal v2 has a capacitance C2. The wiring delay caused by the wiring from the terminal s0 to the terminals v1 and v2 can be described as follows.

In the case shown in FIG. 1A, a wiring delay Da(v1) from the terminal s0 to the terminal v1 can be described by the following formula (2), and a wiring delay Da(v2) from the terminal s0 to the terminal v2 can be described by the following formula (3).

$$Da(v1) = rd \times (C+C1+C2) + R \times (C/2+C1+C2) \quad (2)$$

$$Da(v2) = rd \times (C+C1+C2) + R \times (C/2+C1+C2) + R \times C2 \quad (3)$$

On the other hand, in the case shown in FIG. 1B, a wiring delay Db(v1) from the terminal s0 to the terminal v1 can be described by the following formula (4), and a wiring delay Db(v2) from the terminal s0 to the terminal v2 can be described by the following formula (5).

$$Db(v1) = rd \times (3C/2+C1+C2) + R \times C1 \quad (4)$$

$$Db(v2) = rd \times (3C/2+C1+C2) + 2R \times C2 \quad (5)$$

As may be seen from a comparison of FIGS. 1A and 1B, the wiring length in the case shown in FIG. 1A is shorter than the wiring length in the case shown in FIG. 1B when the total wiring length is considered. However, with respect to the delay at the terminal v1, a difference described by the following formula (6) exists between the cases shown in FIGS. 1A and 1B.

$$Da(v1) - Db(v1) = \{rd \times (C+C1+C2) + R \times (C/2+C1+C2)\} - \quad (6)$$
$$\{rd \times (3C/2+C1+C2) + R \times C1\} = rd \times (-C/2) + R \times C2$$

As may be seen from the above formula (6), in a relationship R×C2>rd×(−C/2) stands, the wiring delay at the terminal v1 in the case shown in FIG. 1B is shorter than the wiring delay at the terminal v1 in the case shown in FIG. 1A.

Therefore, it is not necessarily the case that the wiring delay for a shortest total wiring length is always the shortest wiring delay. For this reason, there was a problem in that, according to the conventional method which determines the wiring so that the wiring length becomes the shortest, it is impossible to determine the wiring by accurately taking into consideration the delay of the actual wiring from one terminal to another terminal. In addition, even if the shortest wiring is determined according to the conventional method, a rerouting of the wiring is made depending on the wiring density or disorder which occurs thereafter, and there was another problem in that the wiring which is determined does not accurately take into account the delay of the actual wiring which is finally obtained.

SUMMARY OF THE INVENTION

Accordingly, it is a general object of the present invention to provide a novel and useful global routing determination method and storage medium, in which the problems described above are eliminated.

Another and more specific object of the present invention is to provide a global routing determination method which can determine a global routing of a circuit by accurately taking into account a delay of an actual wiring from one terminal to another terminal, and to provide a computer-readable storage medium which stores a program for causing a computer to determine the global routing of the circuit according to such a global routing determination method.

Still another object of the present invention is to provide a global routing determination method which successively divides a region which includes cells forming a circuit into a plurality of blocks, and hierarchically determines a global routing among the cells while arranging the cells in the blocks, comprising the steps of (a) selecting a K-pattern which indicates a position of at least one terminal which is to be coupled by a wiring with respect to a predetermined number of blocks, from a registered K-pattern group, (b) reading Q-patterns which indicate wiring patterns with respect to the selected K-pattern, from a registered Q-pattern group, and (c) determining, as a global routing, a Q-pattern which has a wiring from a source terminal to a target terminal within the selected K-pattern with a signal delay time satisfying a predetermined condition, from among the read Q-patterns, where the predetermined condition places priority on a total wiring length than a density or disorder of wirings among the blocks in which the source terminal and the target terminal exist. According to the global routing determination method of the present invention, it is possible to determine the global routing by accurately taking into consideration a delay of the actual wiring from one terminal to another terminal, thereby enabling design of a high-performance circuit.

A further object of the present invention is to provide a global routing determination method described above, wherein the step (c) determines, as the global routing, a Q-pattern which minimizes COST(Q) described by a formula $$COST(Q) = COST_{V1}(Q) \times \delta(Q, V1) + COST_{V2}(Q) \times \delta(Q, V2) + COST_{H1}(Q) \times \delta(Q, H1) + COST_{H2}(Q) \times \delta(Q, H2)$$

where each read Q-pattern is made up of 2×2 blocks, boundaries x between two mutually adjacent blocks of the read Q-pattern are respectively denoted by V1, V2, H1 and H2, a function $\delta(Q, x)$ has a value 1 when a wiring passes through the boundary x and has a value 0 when a wiring does not pass through the boundary x, C1 and C2 are constants, C(x) denotes a number of wirings passing through the boundary x, W(x) denotes a number of wirings which can pass through the boundary, and relationships $$COST_{V1}(Q) = C1^{(C(v1)-W(V1))} + C2$$

$$COST_{V2}(Q) = C1^{(C(v2)-W(V2))} + C2$$

$$COST_{H1}(Q) = C1^{(C(H1)-W(H1))} + C2$$

$$COST_{H2}(Q) = C1^{(C(H2)-W(H2))} + C2$$

stand.

Another object of the present invention is to provide a global routing determination method which successively divides a region which includes cells forming a circuit into a plurality of blocks, and hierarchically determines a global routing among the cells while arranging the cells in the blocks, comprising the steps of (a) selecting a K-pattern which indicates a position of at least one terminal which is to be coupled by a wiring with respect to a predetermined number of blocks, from a registered K-pattern group, (b) reading Q-patterns which indicate wiring patterns with respect to the selected K-pattern, from a registered Q-pattern group, and (c) determining, as a global routing, a Q-pattern which has a wiring from a source terminal to a target terminal within the selected K-pattern with a signal delay time satisfying a predetermined condition, from among the read Q-patterns, where the step (c) determines, as the global routing, a Q-pattern which minimizes a slack S described by formulas $$S = \sum_{\forall target i} 0 : maxDelay(i) - delay(i) \geq 0$$

$$delay(i) - maxDelay(i) : maxDelay(i) - delay(i) < 0$$

where maxDelay (i) denotes a signal delay time caused by a wiring from a requested source terminal to a target terminal, and delay(i) denotes a signal delay time which is obtained as a result of actually forming the wiring from the source terminal to the target terminal. According to the global routing determination method of the present invention, it is possible to determine the global routing by accurately taking into consideration a delay of the actual wiring from one terminal to another terminal, thereby enabling design of a high-performance circuit.

Still another object of the present invention is to provide a global routing determination method described above, wherein the signal delay time delay(i) is an Elmore delay described by a formula $$D(v) = rdC_{s0} + \sum_{ev \in path(s0,v)} r_{ev}(C_{ev}/2 + Cv)$$

where a tree T has a source s0, an edge from a node v towards the source s0 is denoted by ev, a resistance of the edge ev is denoted by $r_{ev}$, a capacitance of the edge ev is denoted by $C_{ev}$, a subtree of the node v is denoted by Tv, a capacitance of the subtree Tv is denoted by Cv, an ON-resistance of an output driver of the source s0 is denoted by rd, a sum total of wiring lengths is denoted by $C_{s0}$ and the Elmore delay D(v) indicates a delay from the source s0 to the target v.

A further object of the present invention is to provide a computer-readable storage medium which stores a program for causing a computer to successively divide a region which includes cells forming a circuit into a plurality of blocks, and to hierarchically determine a global routing among the cells while arranging the cells in the blocks, comprising first means for causing the computer to select a K-pattern which indicates a position of at least one terminal which is to be coupled by a wiring with respect to a predetermined number of blocks, from a registered K-pattern group, second means for causing the computer to read Q-patterns which indicate wiring patterns with respect to the selected K-pattern, from a registered Q-pattern group, and third means for causing the computer to determine, as a global routing, a Q-pattern which has a wiring from a source terminal to a target terminal within the selected K-pattern with a signal delay time satisfying a predetermined condition, from among the read Q-patterns, where the predetermined condition places priority on a total wiring length than a density or disorder of wirings among the blocks in which the source terminal and the target terminal exist. According to the computer-readable storage medium of the present invention, it is possible to determine the global routing by accurately taking into consideration a delay of the actual wiring from one terminal to another terminal, thereby enabling design of a high-performance circuit.

Another object of the present invention is to provide a computer-readable storage medium which stores a program for causing a computer to successively divide a region which includes cells forming a circuit into a plurality of blocks, and to hierarchically determine a global routing among the cells while arranging the cells in the blocks, comprising first means for causing the computer to select a K-pattern which indicates a position of at least one terminal which is to be coupled by a wiring with respect to a predetermined number of blocks, from a registered K-pattern group, second means for causing the computer to read Q-patterns which indicate wiring patterns with respect to the selected K-pattern, from a registered Q-pattern group, and third means for causing the computer to determine, as a global routing, a Q-pattern which has a wiring from a source terminal to a target terminal within the selected K-pattern with a signal delay time satisfying a predetermined condition, from among the read Q-patterns, where the third means determines, as the global routing, a Q-pattern which minimizes a slack S described by formulas $$S = \sum_{\forall target i} 0 : maxDelay(i) - delay(i) \geq 0$$

delay($i$)−maxDelay($i$):maxDelay($i$)−delay($i$)<0 where maxDelay (i) denotes a signal delay time caused by a wiring from a requested source terminal to a target terminal, and delay(i) denotes a signal delay time which is obtained as a result of actually forming the wiring from the source terminal to the target terminal. According to the computer-readable storage medium of the present invention, it is possible to determine the global routing by accurately taking into consideration a delay of the actual wiring from one terminal to another terminal, thereby enabling design of a high-performance circuit.

Other objects and further features of the present invention will be apparent from the following detailed description when read in conjunction with the accompanying drawings.

BRIEF DESCRIPTION OF THE DRAWINGS

FIG. 8A and FIGS. 8B and 8C respectively are diagrams showing the K-pattern and the Q-patterns for a case where 2 terminals exist in 2×2 blocks and 2 blocks having 1 terminal exist;

DESCRIPTION OF THE PREFERRED EMBODIMENTS

Figure 1B:
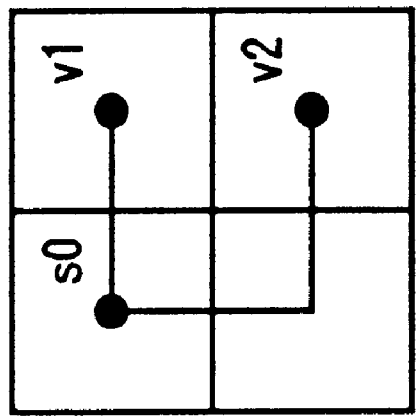
FIGS. 1A and 1B respectively are diagrams showing a case where a region including cells which form a circuit is successively divided into a plurality of blocks, and a global routing among the cells is hierarchically determined while arranging the cells in the blocks.
Figure 1A:
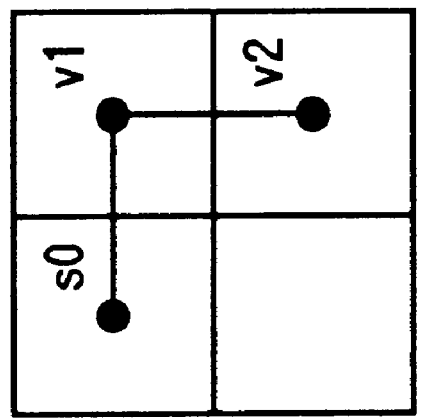
Figure 2:
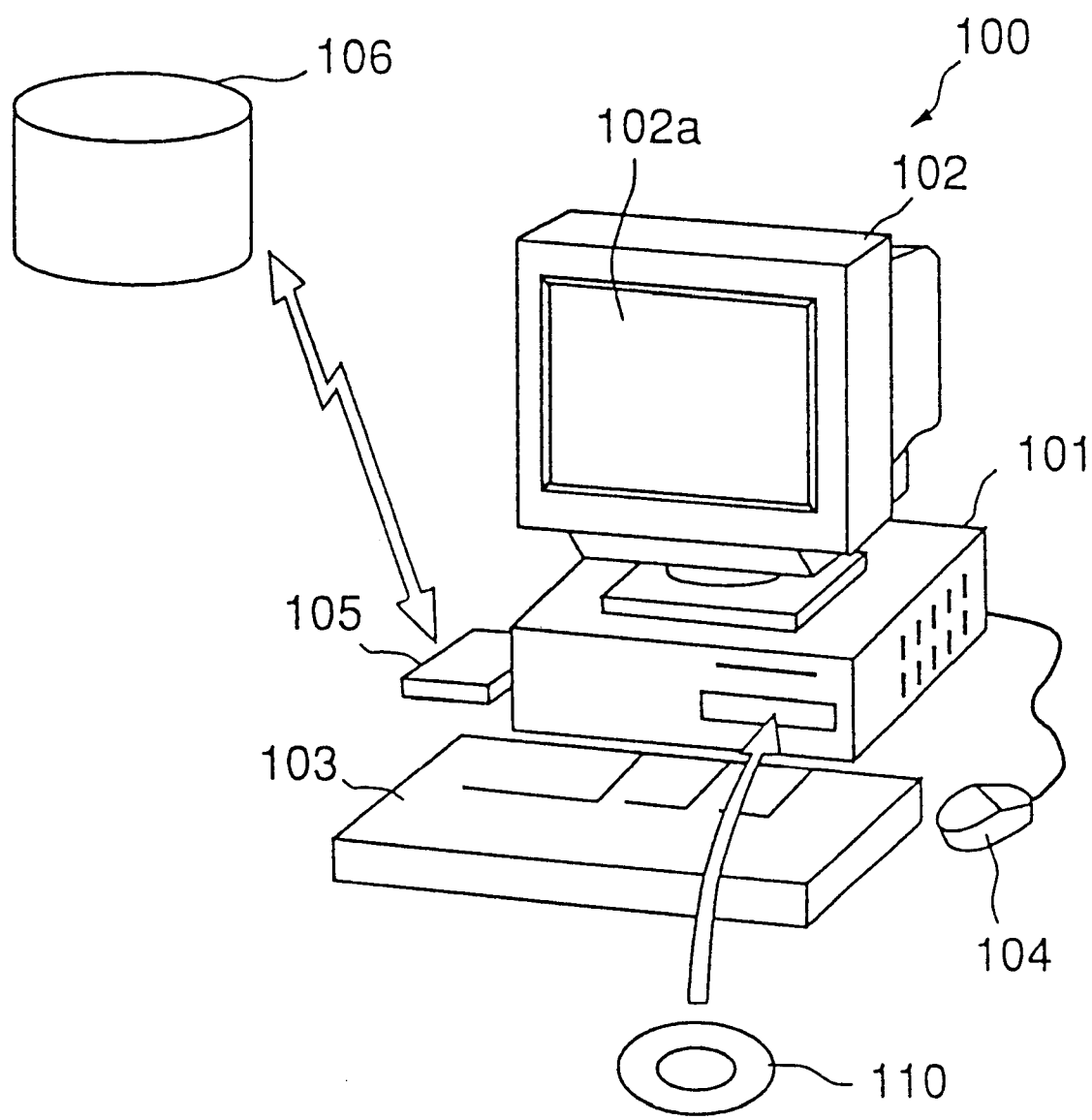
FIG. 2 is a perspective view showing a computer system which realizes a global routing method according to the present invention.
Figure 3:
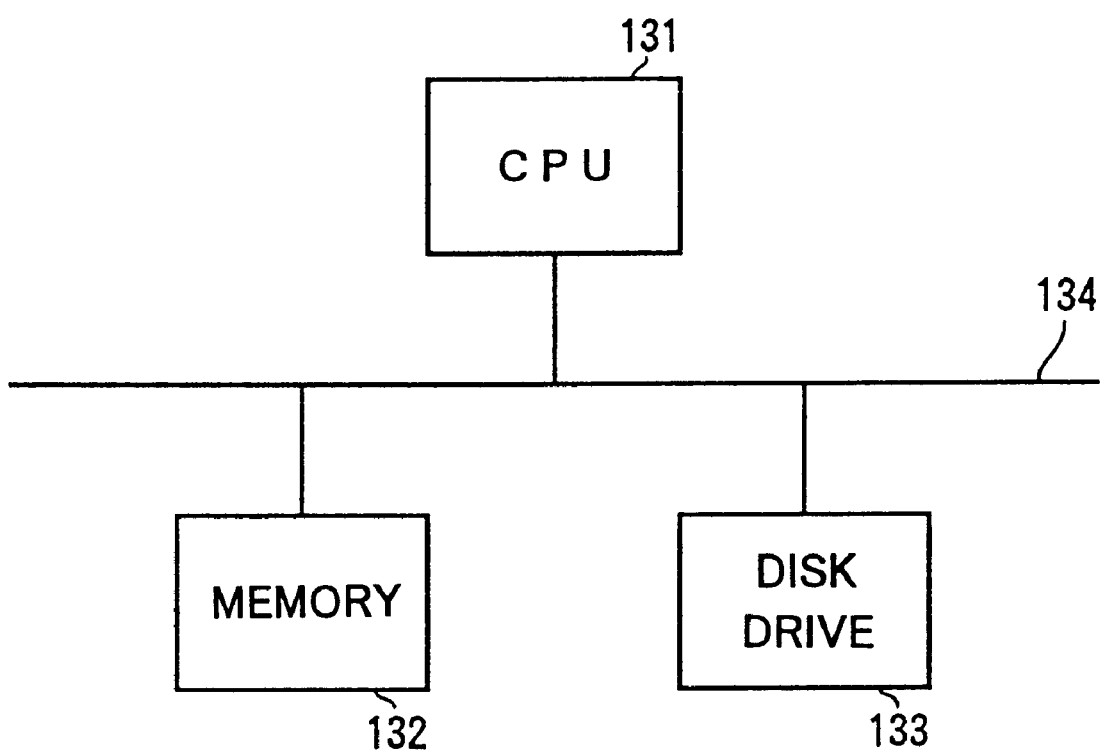
FIG. 3 is a system block diagram showing an important part of a main body part shown in FIG. 2.

FIG. 2 is a perspective view showing a computer system which realizes a global routing method according to the present invention, and FIG. 3 is a system block diagram showing an important part of a main body part shown in FIG. 2.

In FIG. 2, a computer system 100 includes a main body part 101 which includes a CPU, a disk drive and the like, a display 102 which displays an image on a display screen 102a in response to an instruction from the main body part 101, a keyboard 103 which is used to input various information to the computer system 100, a mouse 104 which is used to specify an arbitrary position on the display screen 102a of the display 102, and a modem 105 which is used to make access to an external database or the like and to download a program or the like stored in another computer system.

A program for causing the computer system 100 to carry out a global routing determination process may be stored in a portable recording medium such as a disk 100 or, may be downloaded from a recording medium 106 of another computer system using a communication unit such as the modem 105.

A storage medium according to the present invention is formed by a computer-readable storage medium which stores the above described program, and the disk 100, the recording medium 106 and the like may be used for the storage medium. The kind of medium used for the storage medium is not limited to a specific type, and any portable recording medium such as IC card memories, floppy disks, magneto-optical disks and CD-ROMs, and any recording medium accessible by a computer system which is coupled via a communication means or a communication unit such as the modem and LAN, may be used for the storage medium.

As shown in FIG. 3, the important part of the main body part 101 has a known construction including a CPU 131, a memory 132 and a disk drive 133 which are coupled via a bus 134. The CPU 131 is provided to control the general operation of the computer system 100. The memory 132 is provided to store data including intermediate data which are obtained during computation processes carried out by the CPU 131. The disk drive 133 is provided to read a program which is to be executed by the CPU 131 from a disk which may be the disk 110 shown in FIG. 2, for example. Of course, the program may be stored in the memory 132. In addition, it is not essential for the program to be stored in the memory 132 or the disk within the disk drive 133, and the program may be downloaded from another computer system.

Figure 4:
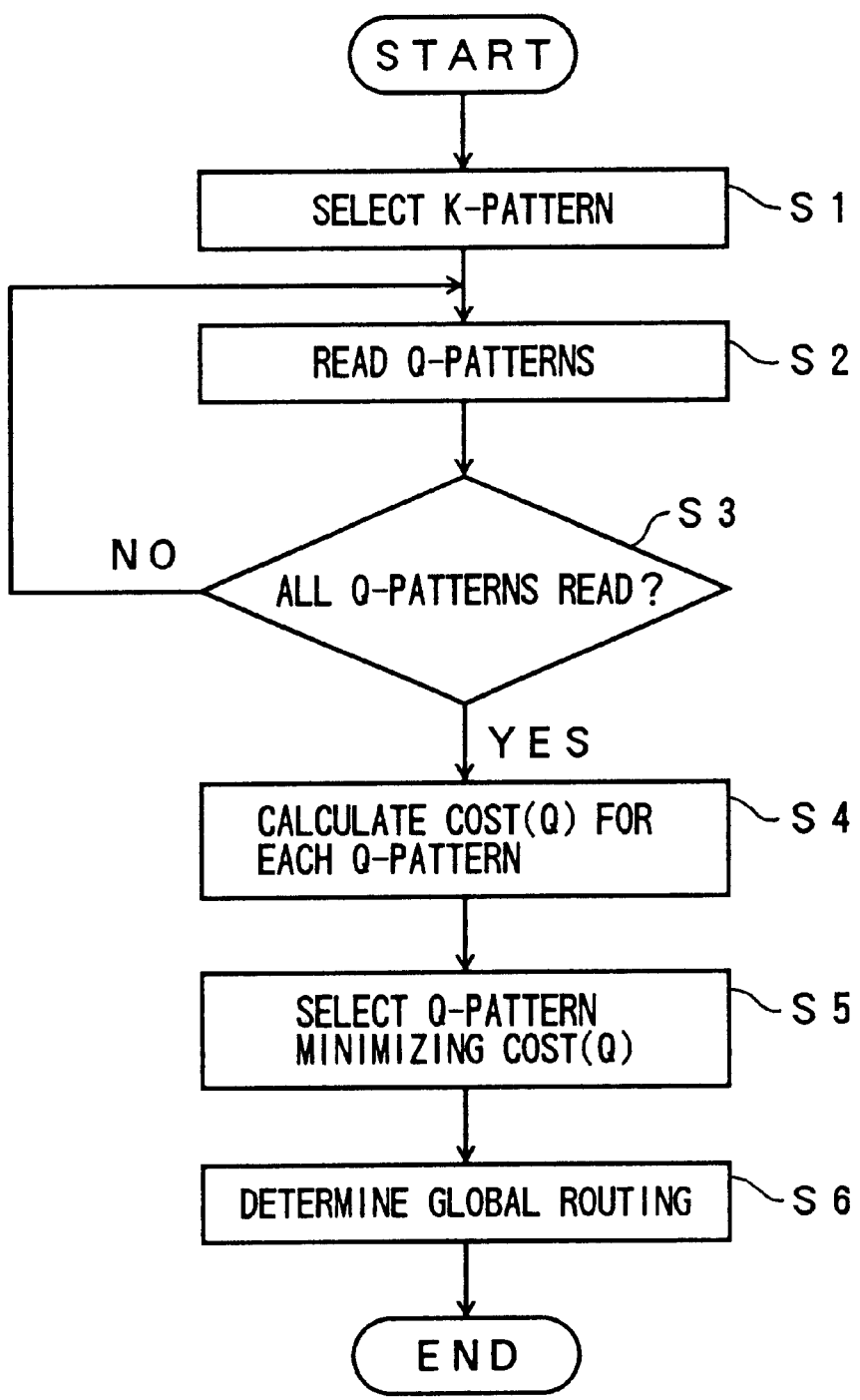
FIG. 4 is a flow chart for explaining a process carried out by the computer system in a first embodiment of the global routing method according to the present invention.

FIG. 4 is a flow chart for explaining a process carried out by the computer system 100 shown in FIGS. 2 and 3 in a first embodiment of a global routing determination method according to the present invention. A first embodiment of a storage medium according to the present invention is formed by a computer-readable storage medium such as the disk 110, and stores a program for causing the computer system 100 to carry out the process shown in FIG. 4.

The process shown in FIG. 4 is a global routing determination process which successively divides a region including cells which form a circuit into a plurality of blocks, and hierarchically determines a global routing among the cells while arranging the cells in the blocks. As described above, when designing the integrated circuit such as the LSI circuit by CAD, it is possible to roughly categorize the design stage into the logic design and the physical design. The logic design determines how to realize the logic of the circuit which is to be designed. The physical design determines the arrangement (also referred to as layout or placement) of elements such as cells and gates, wirings and the like which form the circuit, based on the result of the logic design. When making the physical design, the layout of the wirings is basically determined by the global routing and the local (or detailed) routing. The global routing determines the general arrangement of the wirings together with the general arrangement of the elements and the like, and the global routing determination process relates to the determination of this global routing.

In FIG. 4, a step S1 selects a K-pattern which indicates positions of terminals to be connected by a wiring with respect to a predetermined number of blocks, from a K-pattern group registered in the memory 132, for example, based on physical design data. In the description given hereinafter, it is assumed for the sake of convenience that the predetermined number of blocks is 2×2 blocks.

Figure 5B:
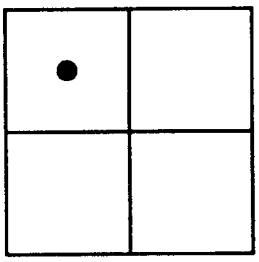
FIGS. 5A, 5B, 5C and 5D respectively are diagrams showing K-patterns for a case where 1 terminal exists in 2×2 blocks and 1 block which includes 1 terminal exists.
Figure 5D:
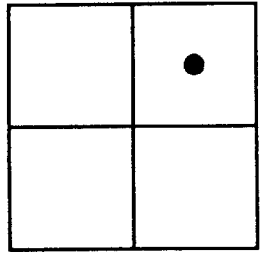
Figure 5A:
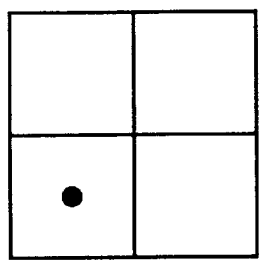
Figure 5C:
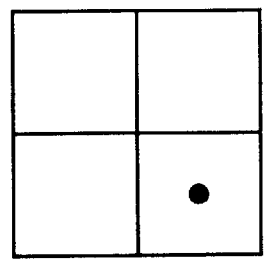

FIGS. 5A, 5B, 5C and 5D respectively are diagrams showing K-patterns for a case where 1 terminal exists in 2×2 blocks and 1 block which includes 1 terminal exists. FIG. 5A shows a K-pattern K(0), FIG. 5B shows a K-pattern K(1), FIG. 5C shows a K-pattern K(2), and FIG. 5D shows a K-pattern K(3). In this case, only 1 terminal exists in the 2×2 blocks, and thus, Q-patterns indicating wiring patterns with respect to the K-patterns K(0), K(1), K(2) and K(3) actually do not exist, but will respectively be denoted by Q(0, 0), Q(1, 0), Q(2, 0) and Q(3, 0) for the sake of convenience.

Figure 6A:
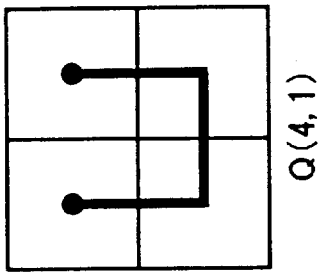
FIG. 6A and FIGS. 6B and 6C respectively are diagrams showing the K-pattern and Q-patterns for a case where 2 terminals exist in 2×2 blocks and 2 blocks having 1 terminal exist.
Figure 6B:
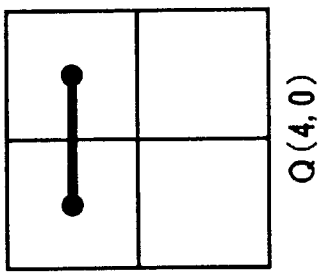
Figure 6C:
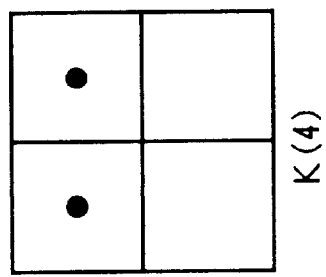

FIG. 6A and FIGS. 6B and 6C respectively are diagrams showing the K-pattern and the Q-patterns for a case where 2 terminals exist in 2×2 blocks and 2 blocks having 1 terminal exist. FIG. 6A shows a K-pattern K(4), and FIGS. 6B and 6C respectively show Q-patterns Q(4, 0) and Q(4, 1) indicating wiring patterns with respect to the K-pattern K(4).

Figure 7C:
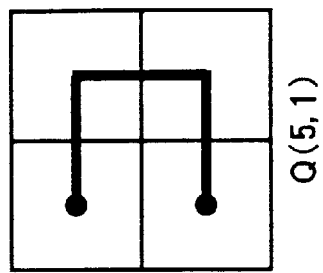
FIG. 7A and FIGS. 7B and 7C respectively are diagrams showing the K-pattern and the Q-patterns for a case where 2 terminals exist in 2×2 blocks and 2 blocks having 1 terminal exist.
Figure 7B:
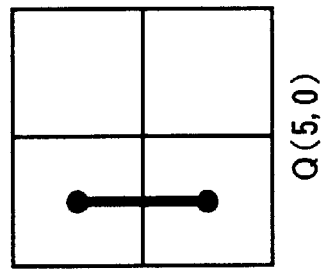
Figure 7A:
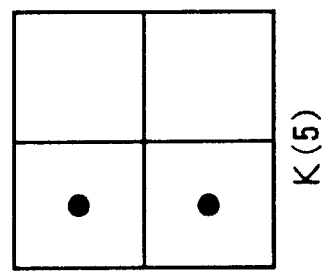

Similarly, FIG. 7A and FIGS. 7B and 7C respectively are diagrams showing the K-pattern and the Q-patterns for a case where 2 terminals exist in 2×2 blocks and 2 blocks having 1 terminal exist. FIG. 7A shows a K-pattern K(5), and FIGS. 7B and 7C respectively show Q-patterns Q(5, 0) and Q(5, 1) indicating wiring patterns with respect to the K-pattern K(5).

FIG. 8A and FIGS. 8B and 8C respectively are diagrams showing the K-pattern and the Q-patterns for a case where 2 terminals exist in 2×2 blocks and 2 blocks having 1 terminal exist. FIG. 8A shows a K-pattern K(6), and FIGS. 8B and 8C respectively show Q-patterns Q(6, 0) and Q(6, 1) indicating wiring patterns with respect to the K-pattern K(6).

Figure 9C:
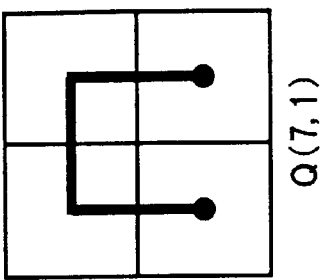
FIG. 9A and FIGS. 9B and 9C respectively are diagrams showing the K-pattern and the Q-patterns for a case where 2 terminals exist in 2×2 blocks and 2 blocks having 1 terminal exist.
Figure 9B:
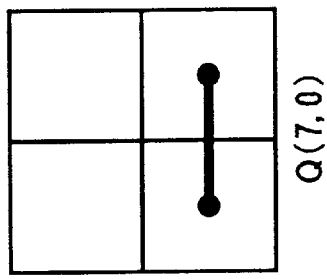
Figure 9A:
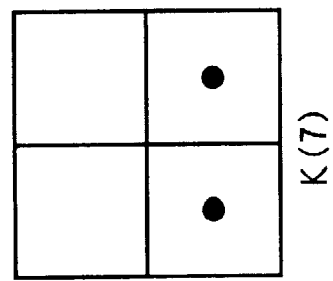

FIG. 9A and FIGS. 9B and 9C respectively are diagrams showing the K-pattern and the Q-patterns for a case where 2 terminals exist in 2×2 blocks and 2 blocks having 1 terminal exist. FIG. 9A shows a K-pattern K(7), and FIGS. 9B and 9C respectively show Q-patterns Q(7, 0) and Q(7, 1) indicating wiring patterns with respect to the K-pattern K(7).

Figure 10C:
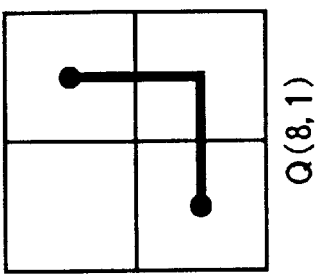
FIG. 10A and FIGS. 10B and 10C respectively are diagrams showing the K-pattern and the Q-patterns for a case where 2 terminals exist in 2×2 blocks and 2 blocks having 1 terminal exist.
Figure 10B:
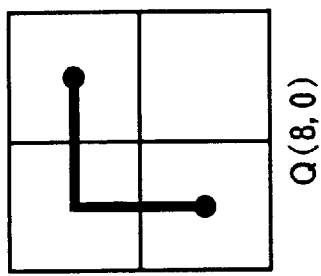
Figure 10A:
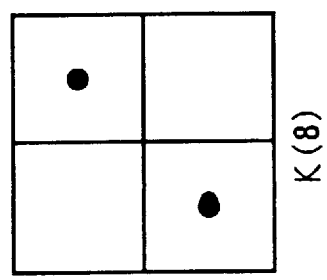

FIG. 10A and FIGS. 10B and 10C respectively are diagrams showing the K-pattern and the Q-patterns for a case where 2 terminals exist in 2×2 blocks and 2 blocks having 1 terminal exist. FIG. 10A shows a K-pattern K(8), and FIGS. 10B and 10C respectively show Q-patterns Q(8, 0) and Q(8, 1) indicating wiring patterns with respect to the K-pattern K(8).

Figure 11A:
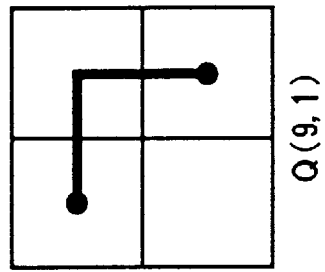
FIG. 11A and FIGS. 11B and 11C respectively are diagrams showing the K-pattern and the Q-patterns for a case where 2 terminals exist in 2×2 blocks and 2 blocks having 1 terminal exist.
Figure 11B:
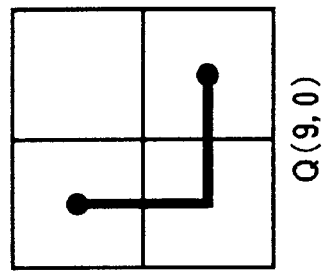
Figure 11C:
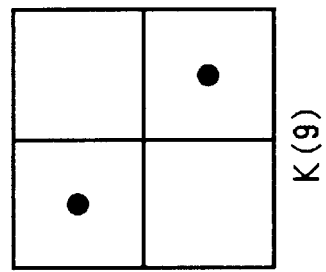

FIG. 11A and FIGS. 11B and 11C respectively are diagrams showing the K-pattern and the Q-patterns for a case where 2 terminals exist in 2×2 blocks and 2 blocks having 1 terminal exist. FIG. 11A shows a K-pattern K(9), and FIGS. 11B and 11C respectively show Q-patterns Q(9, 0) and Q(9, 1) indicating wiring patterns with respect to the K-pattern K(9).

Figure 12A:
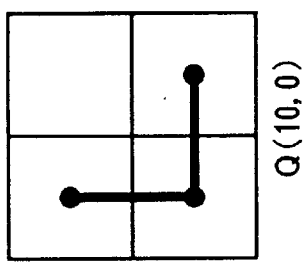
FIG. 12A and FIGS. 12B, 12C and 12D respectively are diagrams showing a K-pattern and Q-patterns for a case where 3 terminals exist in 2×2 blocks and 3 blocks having 1 terminal exist.
Figure 12B:
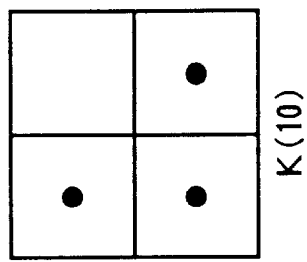
Figure 12C:
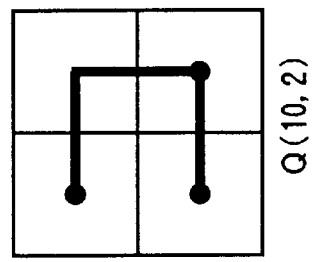
Figure 12D:
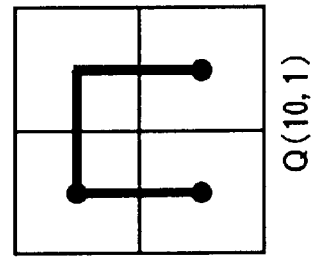

In addition, FIG. 12A and FIGS. 12B, 12C and 12D respectively are diagrams showing the K-pattern and the Q-patterns for a case where 3 terminals exist in 2×2 blocks and 3 blocks having 1 terminal exist. FIG. 12A shows a K-pattern K(10), and FIGS. 12B, 12C and 12D respectively show Q-patterns Q(10, 0), Q(10, 1) and Q(10, 2) indicating wiring patterns with respect to the K-pattern K(10).

Figure 13A:
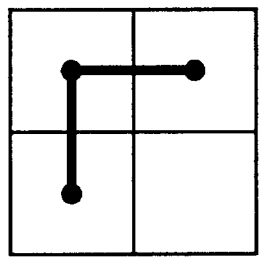
FIG. 13A and FIGS. 13B, 13C and 13D respectively are diagrams showing the K-pattern and the Q-patterns for a case where 3 terminals exist in 2×2 blocks and 3 blocks having 1 terminal exist.
Figure 13B:
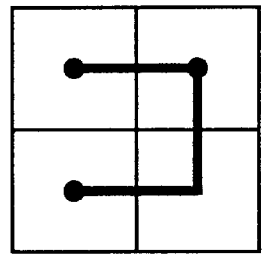
Figure 13C:
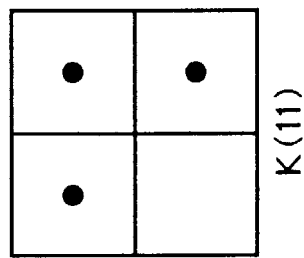
Figure 13D:
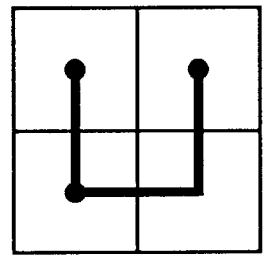

FIG. 13A and FIGS. 13B, 13C and 13D respectively are diagrams showing the K-pattern and the Q-patterns for a case where 3 terminals exist in 2×2 blocks and 3 blocks having 1 terminal exist. FIG. 13A shows a K-pattern K(11), and FIGS. 13B, 13C and 13D respectively show Q-patterns Q(11, 0), Q(11, 1) and Q(11, 2) indicating wiring patterns with respect to the K-pattern K(11).

Figure 14A:
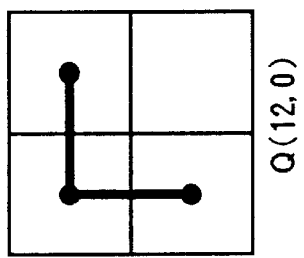
FIG. 14A and FIGS. 14B, 14C and 14D respectively are diagrams showing the K-pattern and the Q-patterns for a case where 3 terminals exist in 2×2 blocks and 3 blocks having 1 terminal exist.
Figure 14B:
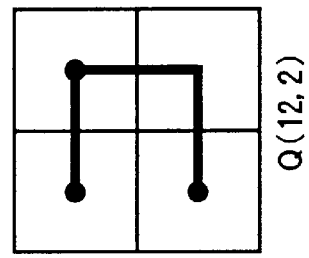
Figure 14C:
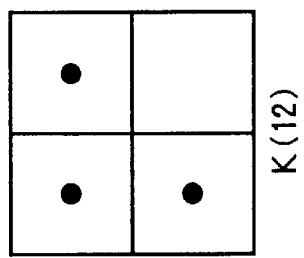
Figure 14D:
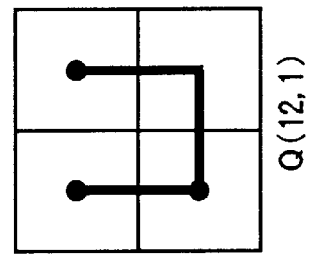

FIG. 14A and FIGS. 14B, 14C and 14D respectively are diagrams showing the K-pattern and the Q-patterns for a case where 3 terminals exist in 2×2 blocks and 3 blocks having 1 terminal exist. FIG. 14A shows a K-pattern K(12), and FIGS. 14B, 14C and 14D respectively show Q-patterns Q(12, 0), Q(12, 1) and Q(12, 2) indicating wiring patterns with respect to the K-pattern K(12).

Figure 15B:
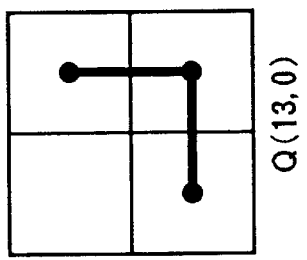
FIG. 15A and FIGS. 15B, 15C and 15D respectively are diagrams showing the K-pattern and the Q-patterns for a case where 3 terminals exist in 2×2 blocks and 3 blocks having 1 terminal exist.
Figure 15D:
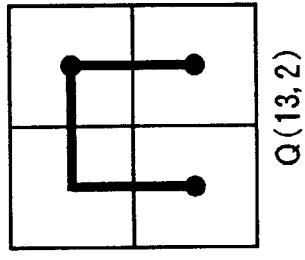
Figure 15A:
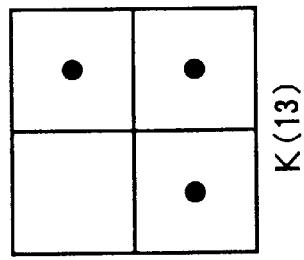
Figure 15C:
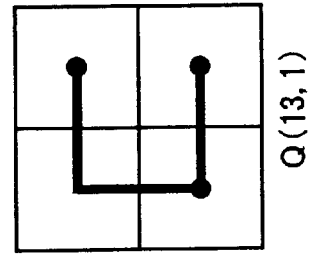

Furthermore, FIG. 15A and FIGS. 15B, 15C and 15D respectively are diagrams showing the K-pattern and the Q-patterns for a case where 3 terminals exist in 2×2 blocks and 3 blocks having 1 terminal exist. FIG. 15A shows a K-pattern K(13), and FIGS. 15B, 15C and 15D respectively show Q-patterns Q(13, 0), Q(13, 1) and Q(13, 2) indicating wiring patterns with respect to the K-pattern K(13).

Figure 16C:
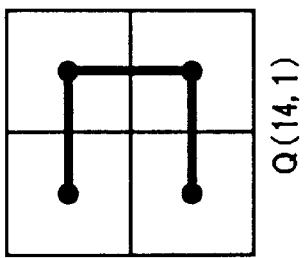
FIG. 16A and FIGS. 16B, 16C, 16D and 16E respectively are diagrams showing a K-pattern and Q-patterns for a case where 4 terminals exist in 2×2 blocks and 4 blocks having 1 terminal exist.
Figure 16E:
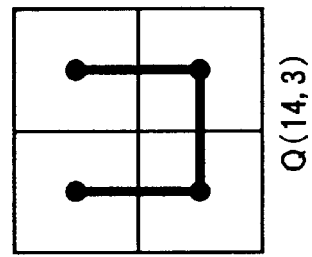
Figure 16B:
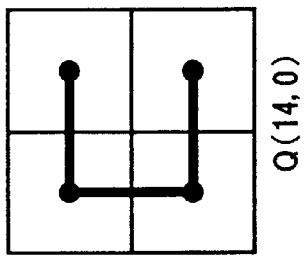
Figure 16D:
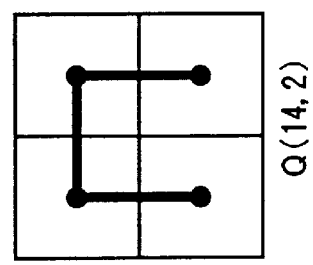
Figure 16A:
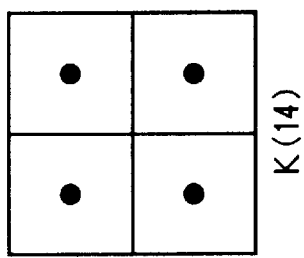

In addition, FIG. 16A and FIGS. 16B, 16C, 16D and 16E respectively are diagrams showing the K-pattern and the Q-patterns for a case where 4 terminals exist in 2×2 blocks and 4 blocks having 1 terminal exist. FIG. 16A shows a K-pattern K(14), and FIGS. 16B, 16C, 16D and 16E respectively show Q-patterns Q(14, 0), Q(14, 1), Q(14, 2) and Q(14, 3) indicating wiring patterns with respect to the K-pattern K(14).

Returning to the description of the process shown in FIG. 4, a step S2 reads Q-patterns which indicate the wiring patterns with respect to the selected K-pattern, from a Q-pattern group registered in the memory 132, for example. In a case where the selected K-pattern is the K-pattern K(10) shown in FIG. 12A, for example, the step S2 reads the Q-patterns Q(10, 0), Q(10, 1) and Q(10, 2) shown in FIGS. 12B, 12C and 12D which indicate the wiring patterns with respect to the K-pattern K(10), from the memory 132.

A step S3 decides whether or not all of the Q-patterns indicating the wiring patterns with respect to the selected K-pattern are read. The process returns to the step S2 if the decision result in the step S3 is NO. On the other hand, if the decision result in the step S3 is YES, a step S4 calculates COST(Q) which will be described later, with respect to each of the read Q-patterns.

Figure 17:
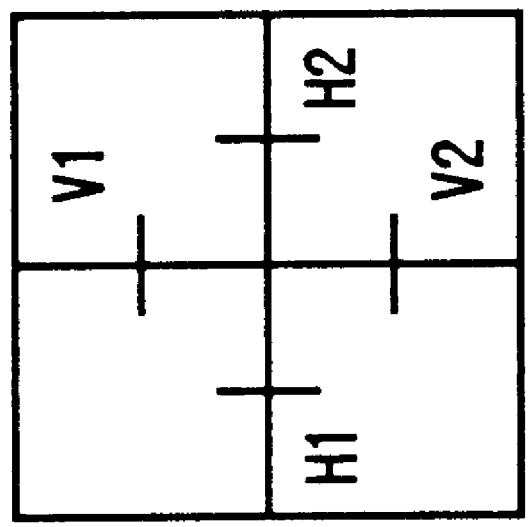
FIG. 17 is a diagram for explaining the calculation of COST(Q) for a case where a read Q-pattern is made up of 2×2 blocks.

For the sake of convenience, it is assumed that, each read Q-pattern is made up of 2×2 blocks, boundaries x between two mutually adjacent blocks of the read Q-pattern are respectively denoted by V1, V2, H1 and H2 as shown in FIG. 17, and a function $\delta(Q, x)$ has a value 1 when the wiring passes through the boundary x and has a value 0 when the wiring does not pass through the boundary x. It is also assumed that C1 and C2 are constants, C(x) denotes a number of wirings passing through the boundary x, and W(x) denotes a number of wirings which can pass through the boundary. In addition, it is further assumed that the following relationships stand.

$$COST_{V1}(Q)=C1^{(C(V1)-W(V1))}+C2$$

$$COST_{V2}(Q)=C1^{(C(V2)-W(V2))}+C2$$

$$COST_{H1}(Q)=C1^{(C(H1)-W(H1))}+C2$$

$$COST_{H2}(Q)=C1^{(C(H2)-W(H2))}+C2$$

The step S4 calculates COST(Q) based on the following formula (7).

$$COST(Q)=COST_{V1}(Q)\times\delta(Q, V1)+COST_{V2}(Q)\times\delta(Q, V2)+ \\ COST_{H1}(Q)\times\delta(Q, H1)+COST_{H2}(Q)\times\delta(Q, H2) \quad (7)$$

A step S5 selects the Q-pattern which makes the COST (Q) calculated in the step S4 a minimum, from among the read Q-patterns. A step S6 determines the Q-pattern selected in the step S5 as a global routing, and the process ends. Based on the global routing which is determined in this manner, the local (or detailed) routing is carried out. Since the local routing itself is not directly related to the subject matter of the present invention, a description thereof will be omitted in this specification.

In this embodiment, the step S5 selects the Q-pattern which makes the COST(Q) the minimum. For this reason, the Q-pattern is selected by placing priority on the total wiring length, over the wiring density or disorder of the wirings between a block including a terminal which becomes a source and a block including a terminal which becomes a target. Consequently, it is possible to take measures so that the Q-patterns which do not minimize the wiring between the source and the target are not selected from among the Q-patterns shown in FIGS. 6B, 6C, 7B, 7C, 8B, 8C, 9B, 9C, 10B, 10C, 11B, 11C, 12B through 12D, 13B through 14D, and 15B through 15D, for example. Such Q-patterns which do not minimize the wiring between the source and the target, and thus are not selected are, the Q-patterns (4, 1), Q(5, 1), Q(6, 1), Q(7, 1), Q(10, 1), Q(10, 2), Q(11, 1), Q(11, 2), Q(12, 1), Q(12, 2), Q(13, 1) and Q(13, 2), for example.

Figure 18:
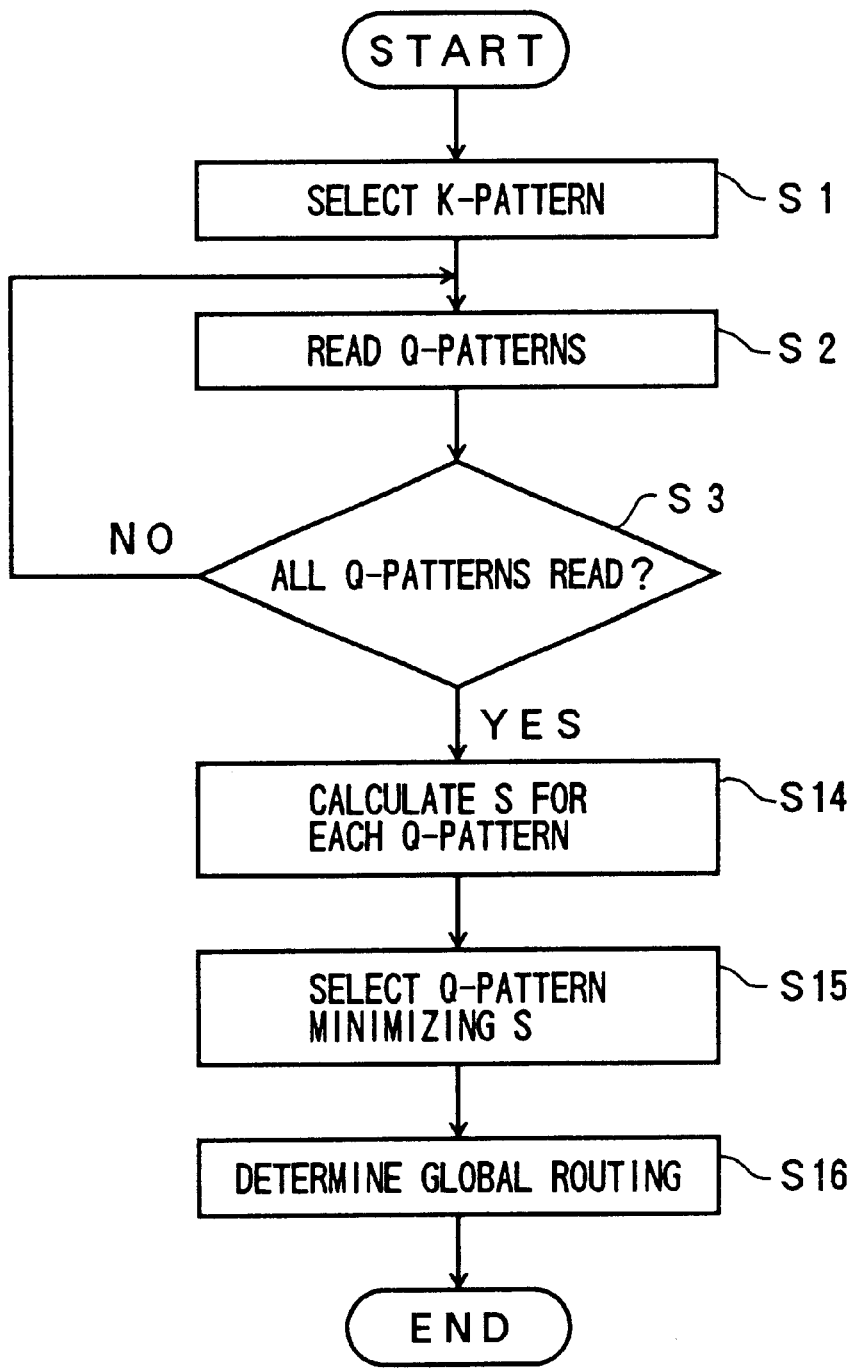
FIG. 18 is a flow chart for explaining a process carried out by the computer system in a second embodiment of the global routing determination method according to the present invention.

FIG. 18 is a flow chart for explaining a process carried out by the computer system 100 shown in FIGS. 2 and 3 in a second embodiment of the global routing determination method according to the present invention. A second embodiment of the storage medium according to the present invention is formed by a computer-readable storage medium such as the disk 110, and stores a program for causing the computer system 100 to carry out the process shown in FIG. 18. In FIG. 18, those steps which are the same as those corresponding steps in FIG. 4 are designated by the same reference numerals, and a description thereof will be omitted.

In FIG. 18, if the decision result in the step S3 is YES, a step S14 calculates a slack S which will be described later, with respect to each of the read Q-patterns. For the sake of convenience, it is assumed that a signal delay time caused by the wiring from the requested source to the target is denoted by maxDelay(i), and a signal delay time which is obtained as a result of actually forming the wiring from the source to the target is denoted by delay(i). In this case, the step S14 calculates the slack S described by the following formulas (8).

$$S = \sum_{\forall target i} 0 : maxDelay(i) - delay(i) \geq 0$$

$$delay(i) - maxDelay(i) : maxDelay(i) - delay(i) < 0 \qquad (8)$$

When it is assumed for the sake of convenience that a tree T has a source s0, an edge from a node v towards the source s0 is denoted by ev, a resistance of the edge ev is denoted by $r_{ev}$, a capacitance of the edge ev is denoted by $C_{ev}$, a subtree of the node v is denoted by Tv, a capacitance of the subtree Tv is denoted by Cv, an ON-resistance of an output driver of the source s0 is denoted by rd, and a sum total of the wiring lengths is denoted by $C_{s0}$, the above signal delay time delay(i) is the Elmore delay from the source s0 to the target v and described by the following formula (9).

$$D(v) = rdC_{s0} + \sum_{ev \in path(s0,v)} r_{ev}(C_{ev}/2 + Cv) \qquad (9)$$

A step S15 selects the Q-pattern which makes the slack S calculated in the step S14 a minimum, from among the read Q-patterns. A step S16 determines the Q-pattern selected in the step S15 as a global routing, and the process ends. Based on the global routing which is determined in this manner, the local (or detailed) routing is carried out.

Figure 19:
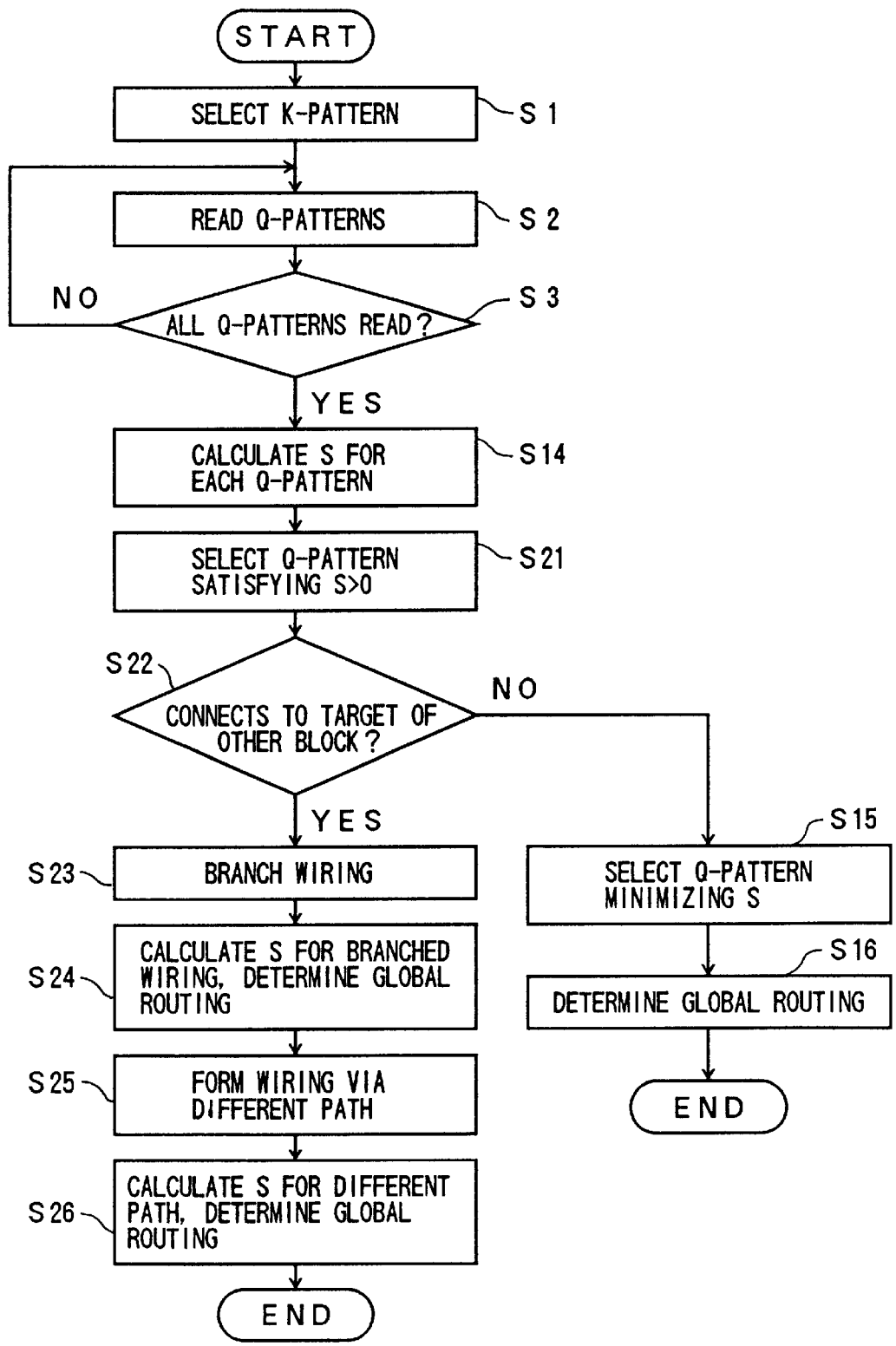
FIG. 19 is a flow chart for explaining a process carried out by the computer system in a third embodiment of the global routing determination method according to the present invention.

FIG. 19 is a flow chart for explaining a process carried out by the computer system 100 shown in FIGS. 2 and 3 in a third embodiment of the global routing determination method according to the present invention. A third embodiment of the storage medium according to the present invention is formed by a computer-readable storage medium such as the disk 110, and stores a program for causing the computer system 100 to carry out the process shown in FIG. 19. In FIG. 19, those steps which are the same as those corresponding steps in FIG. 18 are designated by the same reference numerals, and a description thereof will be omitted.

In FIG. 19, a step S21 obtains the Q-patterns which satisfy S>0, from among the read Q-patterns. A step S22 decides whether or not a target is connected to another target which is included in a block different from a predetermined block which includes the target, with respect to the Q-patterns obtained in the step S21. If the decision result in the step S22 is NO, the process advances to the step S15, and a process similar to that of the second embodiment described above is carried out.

Figure 20B:
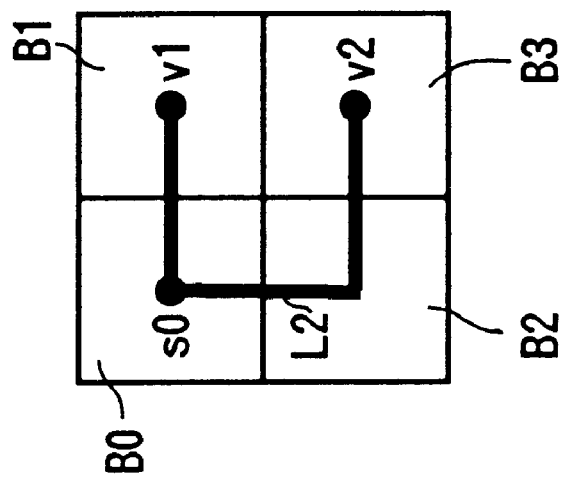
FIGS. 20A and 20B respectively are diagrams for explaining a process of the third embodiment of the global routing determination method.
Figure 20A:
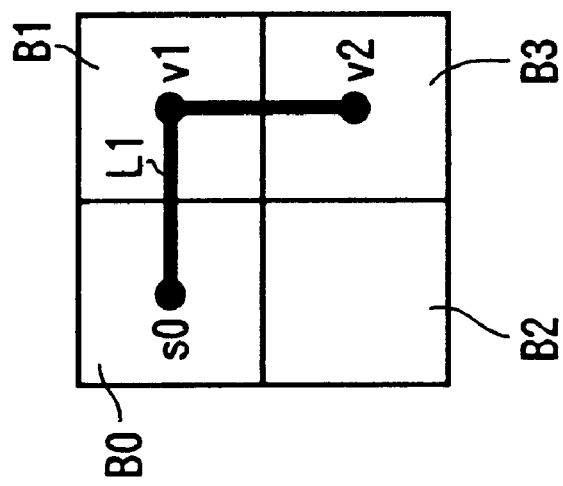

On the other hand, if the decision result in the step S22 is YES, a step S23 branches the wiring from a block which includes the source to a block other than the predetermined block which includes the target. In other words, when the source s0, the targets v1 and v2, and a wiring L1 exist with respect to blocks B0 through B3 with a relationship shown in FIG. 20A, for example, the step S23 branches a wiring portion from the block B0 which includes the source s0 to the target v1 towards the block B2 which is other than the block B1 which includes the target v1, and removes a wiring portion from the target v1 to the other target v2. As a result, a wiring L2 which branches from the block B0, with respect to the block B1, is formed from the source s0 as shown in FIG. 20B. A step S24 calculates the slack S with respect to this branched wiring L2, and employs the wiring L2 if the slack S calculated for the wiring L2 is smaller than the slack S calculated for the wiring L1. In this case, when the signal delay time from the target v1 to the other target v2 caused by the branched wiring L2 is denoted by maxDelay(j), and the signal delay time from the target v1 to the other target v2 when the branched wiring L2 is actually formed is denoted by delay(j), the step S24 determines the Q-pattern which includes the branched wiring L2 to the other target v2 as the global routing if a relationship maxDelay(j)−delay(j)≧0 is satisfied. As a result, the Q-pattern shown in FIG. 20B is selected in place of the Q-pattern shown in FIG. 20A, and this selected Q-pattern is determined as the global routing.

Accordingly, when a target is connected to another target which is included in a block different from a predetermined block which includes the target, with respect to the Q-patterns satisfying S>0, the wiring from the block which includes the source is branched to a block other than the predetermined block which includes the target. In addition, if the signal delay time of the branched wiring is smaller than that of the original wiring, and a relationship maxDelay(j)−delay(j)≧0 is satisfied, where maxDelay(j) denotes the signal delay time caused by the branched wiring and delay(j) denotes the signal delay time of the branched wiring which is actually formed from the target to the other target, the Q-pattern which includes the branched wiring is determined as the global routing.

Figure 21B:
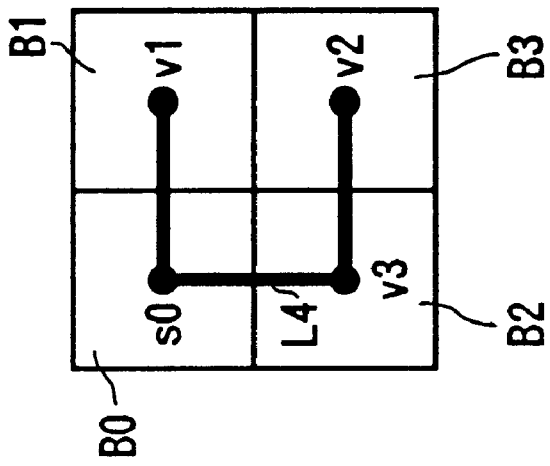
FIGS. 21A and 21B respectively are diagrams for explaining a process of the third embodiment of the global routing determination method.
Figure 21A:
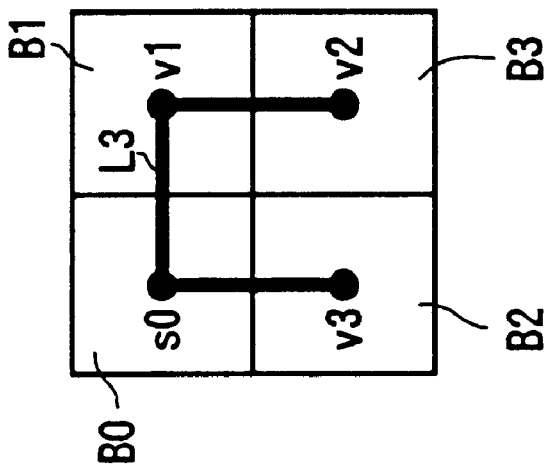

Next, a step S25 removes the wiring from the target to the other target, and forms a wiring to the other target via a path different from that of the removed wiring. In other words, if the source S0, the targets v1, v2 and v3, and a wiring L3 exist with respect to the blocks B0 through B3 with a relationship shown in FIG. 21A, for example, the step S25 removes a wiring portion from the target v1 to the other target v2, and forms a wiring to the other target v2 via a wiring portion other than the removed wiring portion. As a result, a wiring L4 shown in FIG. 21B is formed. This wiring L4 connects the target v1 and the other target v2 via the source s0 and still another target v3. A step S26 calculates the slack S with respect to this wiring L4, and employs this wiring L4 if the slack S calculated for this wiring L4 is smaller than the slack S calculated for the wiring L3. In this case, when the signal delay time from the target v1 to the other target v2 caused by the wiring L4 is denoted by maxDelay(j), and the signal delay time from the target v1 to the other target v2 when the wiring L4 is actually formed is denoted by delay(j), the step S26 determines the Q-pattern which includes the wiring L4 to the other target v2 as the global routing if a relationship maxDelay(j)−delay(j)≧0 is satisfied. As a result, the Q-pattern shown in FIG. 21B is selected in place of the Q-pattern shown in FIG. 21A, and this selected Q-pattern is determined as the global routing.

Accordingly, when a target is connected to another target which is included in a block different from a predetermined block which includes the target, the wiring from the target to the other target is removed and another wiring which connects to the other target is formed via a path other than the that of the removed wiring. In addition, if the signal delay time of the other wiring is smaller than that of the original wiring, and a relationship maxDelay(j)−delay(j)≧0 is satisfied, where maxDelay(j) denotes the signal delay time caused by the other wiring and delay(j) denotes the signal delay time of the other wiring which is actually formed from the target to the other target, the Q-pattern which includes the other wiring is determined as the global routing.

Figure 22:
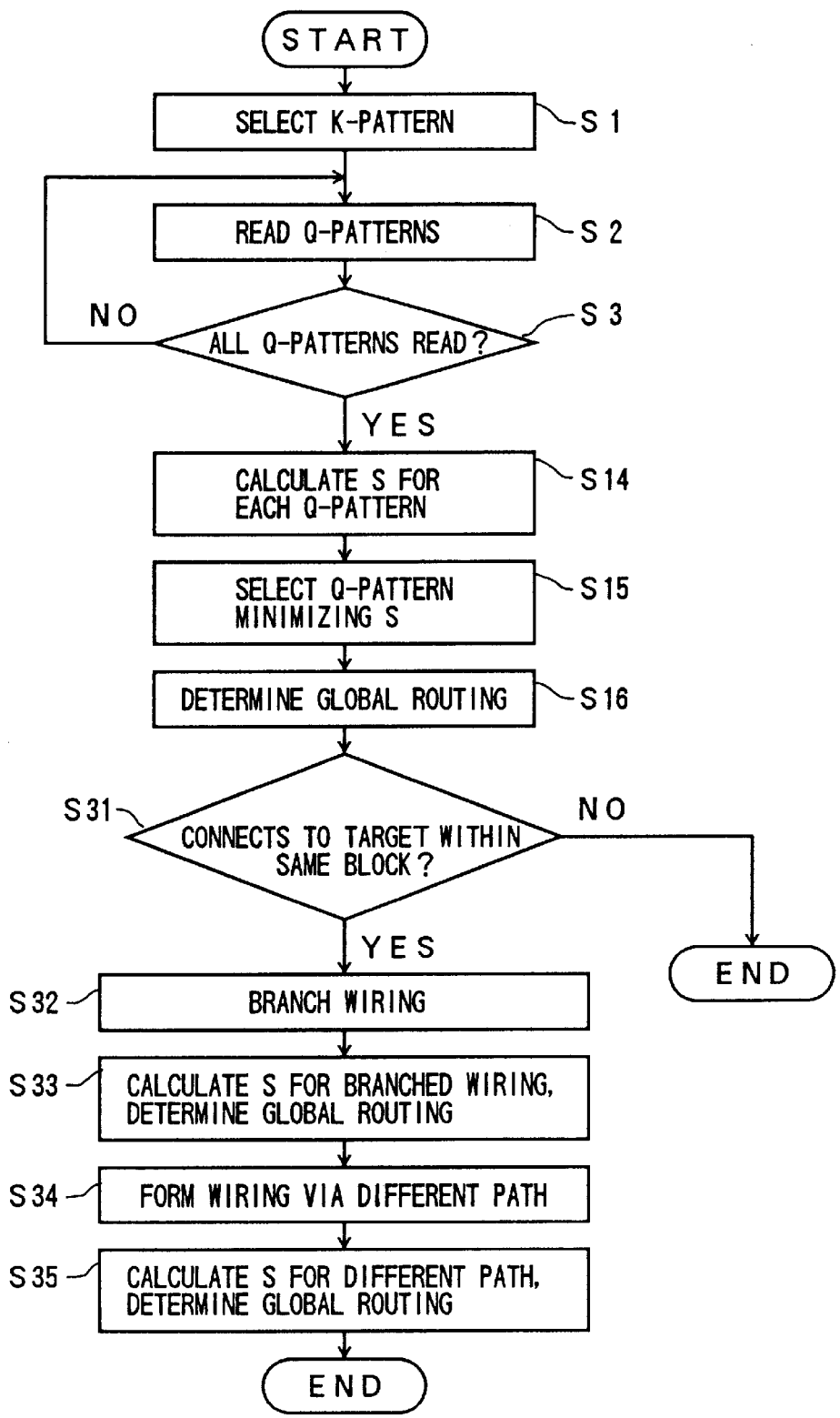
FIG. 22 is a flow chart for explaining a process carried out by the computer system in a fourth embodiment of the global routing determination method according to the present invention.

FIG. 22 is a flow chart for explaining a process carried out by the computer system 100 shown in FIGS. 2 and 3 in a fourth embodiment of the global routing determination method according to the present invention. A fourth embodiment of the storage medium according to the present invention is formed by a computer-readable storage medium such as the disk 110, and stores a program for causing the computer system 100 to carry out the process shown in FIG. 22. In FIG. 22, those steps which are the same as those corresponding steps in FIG. 4 are designated by the same reference numerals, and a description thereof will be omitted.

In FIG. 22, a step S31 decides whether or not a predetermined block which includes a target connected to a source which is included in another block, further includes another target connected to the target. The process ends if the decision result in the step S31 is NO. On the other hand, the process advances to a step S32 if the decision result in the step S31 is YES.

Figure 23A:
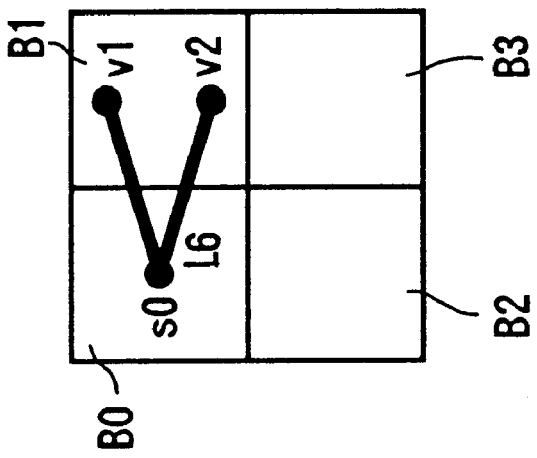
FIGS. 23A and 23B respectively are diagrams for explaining a process of the fourth embodiment of the global routing determination method.
Figure 23B:
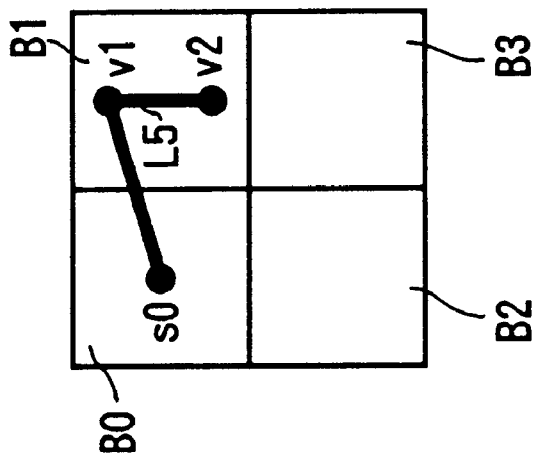

The step S32 branches a wiring from the source to the predetermined block which includes the other target and is other than the block which includes the source. In other words, when the source s0, the targets v1 and v2, and a wiring L5 exist with respect to the blocks B0 through B3 with a relationship shown in FIG. 23A, for example, the step S32 branches the wiring from the block B0 which includes the source s0 to the block B1 which includes the other target v2, and removes a wiring portion from the target v1 to the other target v2. As a result, a wiring L6 which branches from the block B0 which includes the source s0 with respect to the block B1 which includes the other target v2 is formed as shown in FIG. 23B. A step S33 calculates the slack S with respect to the branched wiring L6, and employs the wiring L6 if the slack S calculated for the wiring L6 is smaller than the slack S calculated for the wiring L5. In this case, when the signal delay time from the target v1 to the other target v2 caused by the wiring L6 is denoted by maxDelay(j), and the signal delay time from the target v1 to the other target v2 when the wiring L6 is actually formed is denoted by delay(j), the step S33 determines the Q-pattern which includes the branched wiring L6 to the other target v2 as the global routing if a relationship maxDelay(j)−delay(j)≧0 is satisfied. As a result, the Q-pattern shown in FIG. 23B is selected in place of the Q-pattern shown in FIG. 23A, and this selected Q-pattern is determined as the global routing.

Accordingly, when a target is connected to another target which is included in a predetermined block which includes the target, and no further targets connected to the target exist in blocks other than the predetermined block, the wiring from the block which includes the source is branched to into the predetermined block. In addition, if the signal delay time of the branched wiring is smaller than that of the original wiring, and a relationship maxDelay(j)−delay(j)≧0 is satisfied, where maxDelay(j) denotes the signal delay time caused by the branched wiring and delay(j) denotes the signal delay time of the branched wiring which is actually formed from the source to the other target, the Q-pattern which includes the branched wiring is determined as the global routing.

Figure 24B:
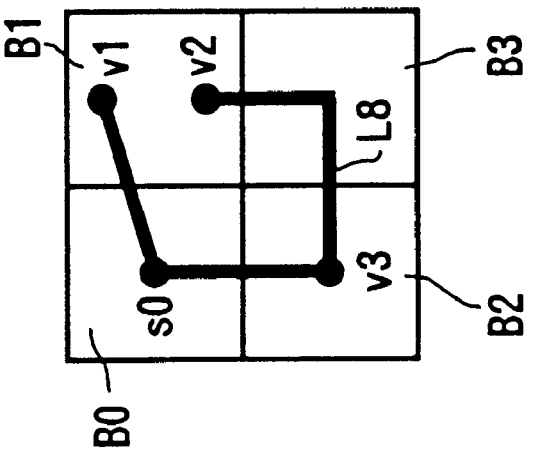
FIGS. 24A and 24B respectively are diagrams for explaining a process of the third embodiment of the global routing determination method.
Figure 24A:
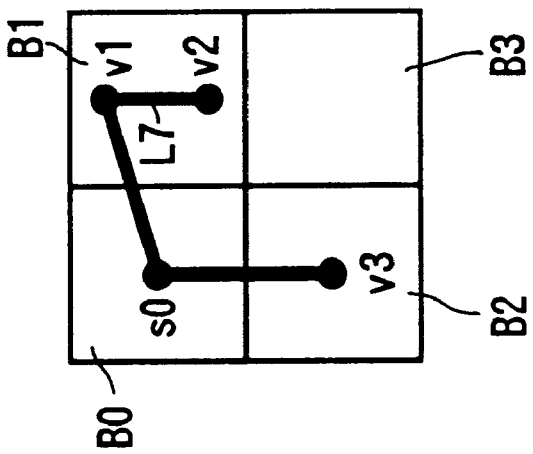

Next, a step S34 removes the wiring from the target to the other target, and forms a wiring from the source to the other target via a path other than that of the removed wiring. In other words, when the source s0, the targets v1, v2 and v3, and a wiring L7 exist with respect to the blocks B0 through B3 with a relationship shown in FIG. 24A, for example, the step S34 removes a wiring portion from the target v1 to the other target v2, and forms a wiring to the other target v2 via a wiring portion other than the removed wiring portion. As a result, a wiring L8 which connects the target v1 to the other target v2 via the source s0 and still another target v3 is formed as shown in FIG. 24B. A step S35 calculates the slack S with respect to the wiring L8, and employs the wiring L8 if the slack S calculated for the wiring L8 is smaller than the slack S calculated for the wiring L7. In this case, when the signal delay time from the target v1 to the other target v2 caused by the wiring L8 is denoted by maxDelay(j), and the signal delay time from the target v1 to the other target v2 when the wiring L8 is actually formed is denoted by delay(j), the step S35 determines the Q-pattern which includes the wiring L8 to the other target v2 as the global routing if a relationship maxDelay(j)−delay(j)≧0 is satisfied. As a result, the Q-pattern shown in FIG. 24B is selected in place of the Q-pattern shown in FIG. 24A, and this selected Q-pattern is determined as the global routing.

Accordingly, when a target is connected to another target which is included in a predetermined block which includes the target, and a further target connected to the target exists in a block other than the predetermined block, the wiring from the target to the other target is removed, and another wiring which connects to the other target is formed via a path different from that of the removed wiring. In addition, if the signal delay time of the other wiring to the other target is smaller than that of the original wiring, and a relationship maxDelay(j)−delay(j)≧0 is satisfied, where maxDelay(j) denotes the signal delay time caused by the other wiring and delay(j) denotes the signal delay time of the other wiring which is actually formed from the target to the other target, the Q-pattern which includes the other wiring is determined as the global routing.

Figure 25:
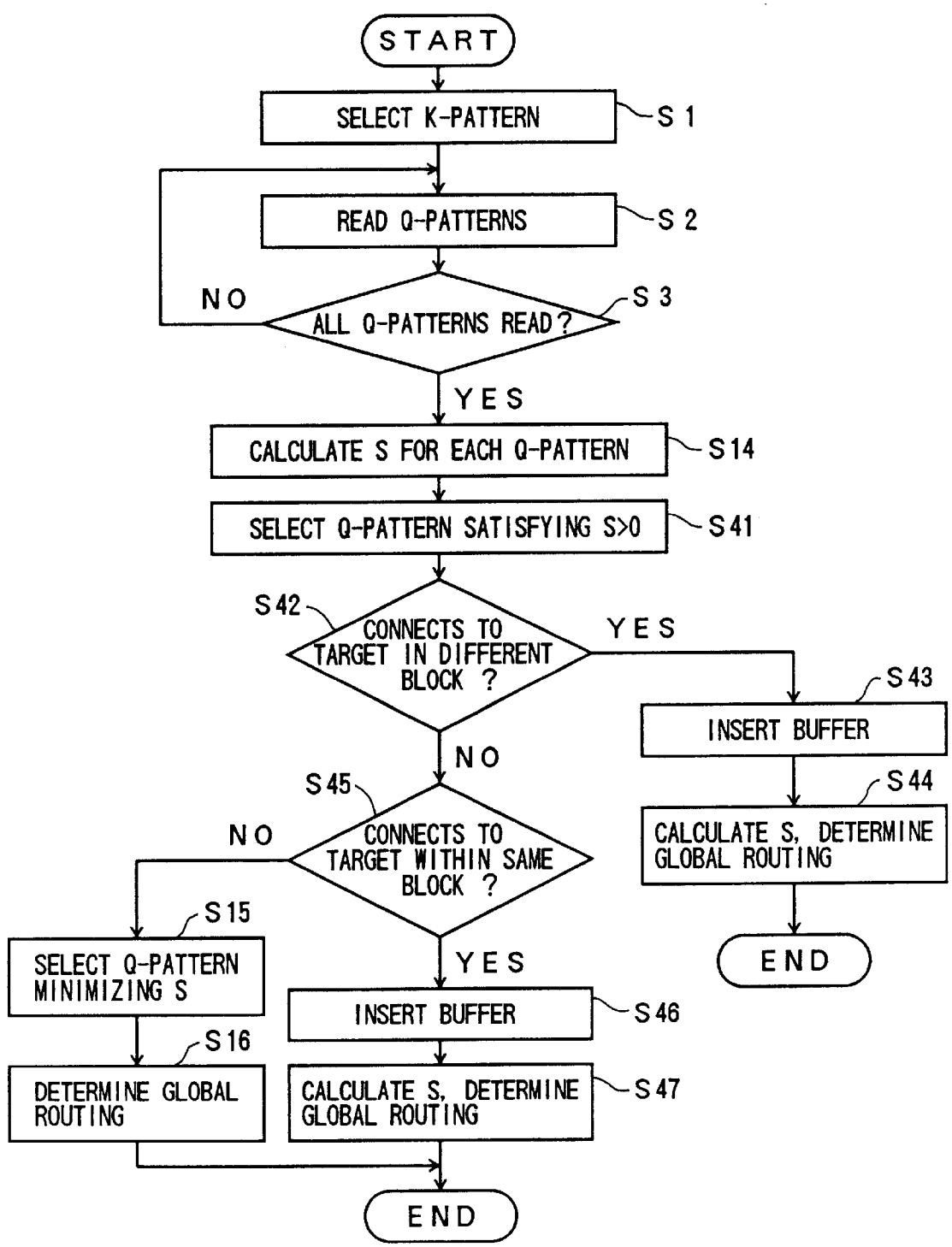
FIG. 25 is a flow chart for explaining a process carried out by the computer system in a fifth embodiment of the global routing determination method according to the present invention.

FIG. 25 is a flow chart for explaining a process carried out by the computer system 100 shown in FIGS. 2 and 3 in a fifth embodiment of the global routing determination method according to the present invention. A fifth embodiment of the storage medium according to the present invention is formed by a computer-readable storage medium such as the disk 110, and stores a program for causing the computer system 100 to carry out the process shown in FIG. 25. In FIG. 25, those steps which are the same as those corresponding steps in FIG. 4 are designated by the same reference numerals, and a description thereof will be omitted.

In FIG. 25, a step S41 obtains the Q-patterns which satisfy a relationship S>0 from among the read Q-patterns. A step S42 decides whether or not, in the Q-pattern obtained in the step S41, a target included in a predetermined block is connected to another target included in a block other than the predetermined block. If the decision result in the step S42 is NO, the process advances to a step S45. The step S45 decides whether or not the target is connected to a further target which is included in the predetermined block which includes the target. A process similar to that of the second embodiment described above is carried out if the decision result in the step S45 is NO.

Figure 26A:
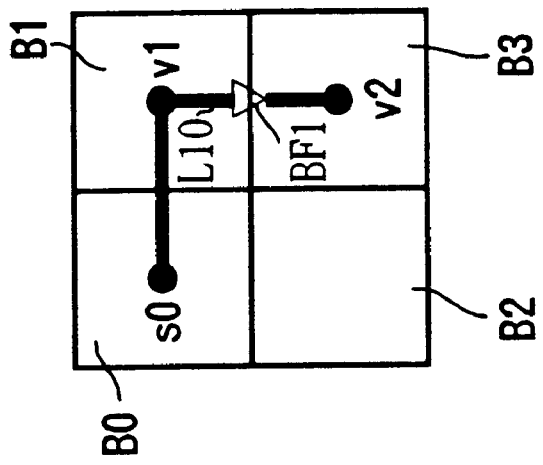
FIGS. 26A and 26B respectively are diagrams for explaining a process of the fifth embodiment of the global routing determination method.
Figure 26B:
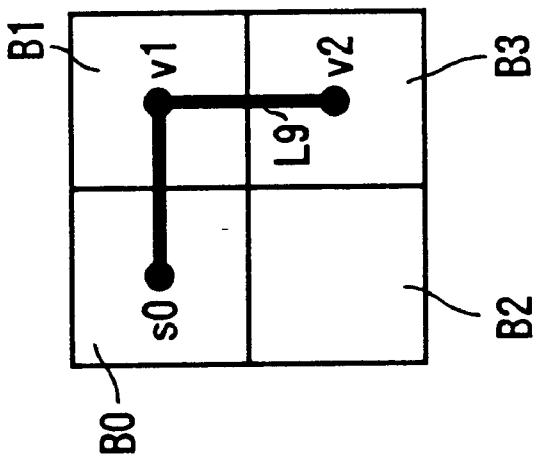

On the other hand, if the decision result in the step S42 is YES, a step S43 inserts a buffer in a wiring from the target to the other target. In other words, when the source s0, the targets v1 and v2, and a wiring L9 exist with respect to the blocks B0 through B3 with a relationship shown in FIG. 26A, for example, the step S43 inserts a buffer BF1 in a wiring portion from the target v1 to the other target v2. As a result, a wiring L10 which is inserted with the buffer BF1 is formed from the target v1 to the other target v2, as shown in FIG. 26B. A step S44 calculates the slack S with respect to the wiring L10, and employs the wiring L10 if the slack S calculated for the wiring L10 is smaller than the slack S calculated for the wiring L9. In this case, when the signal delay time from the target v1 to the other target v2 caused by the wiring L10 is denoted by maxDelay(j), and the signal delay time from the target v1 to the other target v2 when the wiring L10 is actually formed is denoted by delay(j), the step S44 determines the Q-pattern which includes the wiring L10 to the other target v2 as the global routing if a relationship maxDelay(j)−delay(j)≧0 is satisfied. As a result, the Q-pattern shown in FIG. 26B is selected in place of the Q-pattern shown in FIG. 26A, and this selected Q-pattern is determined as the global routing.

Accordingly, with respect to the Q-pattern which satisfies the relationship S>0, when a target is connected to another target which is included in a block other than a predetermined block which includes the target, a buffer is inserted in a wiring from the target to the other target. In addition, if the signal delay time of the wiring to the other target and inserted with the buffer is smaller than that of the original wiring which does not include the buffer, and a relationship maxDelay(j)−delay(j)≧0 is satisfied, where maxDelay(j) denotes the signal delay time caused by the wiring from the target to the other target and inserted with the buffer and delay(j) denotes the signal delay time of the wiring which is actually formed from the target to the other target and is inserted with the buffer, the Q-pattern which includes the wiring to the other target and inserted with the buffer is determined as the global routing.

Figure 27A:
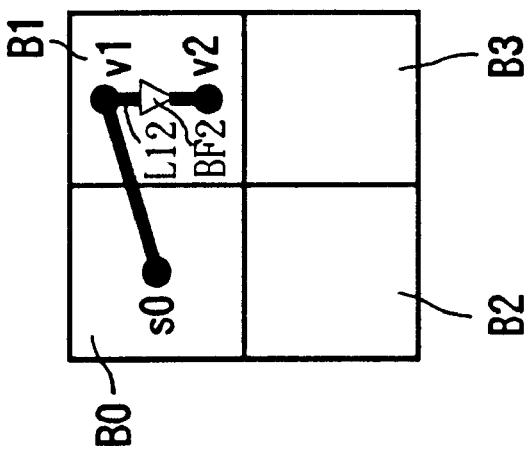
FIGS. 27A and 27B respectively are diagrams for explaining a process of the fifth embodiment of the global routing determination method.
Figure 27B:
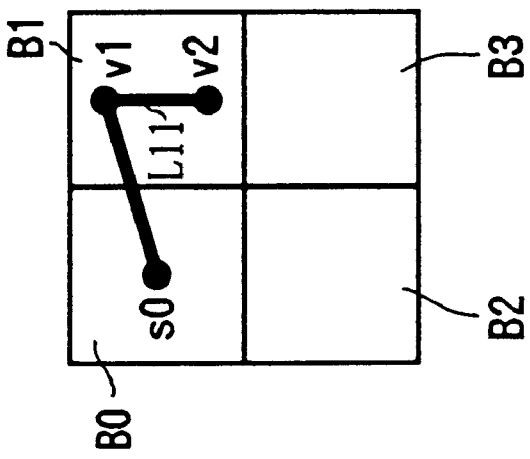

If the decision result in the step S45 is YES, a step S46 inserts a buffer in a wiring from the target to the other target. In other words, when the source s0, the targets v1 and v2, and a wiring L11 exist with respect to the blocks B0 through B3 with a relationship shown in FIG. 27A, for example, the step S46 inserts a buffer BF2 in a wiring portion from the target v1 to the other target v2. As a result, a wiring L12 having the buffer BF2 inserted in the wiring portion from the target v1 to the other target v2 is formed as shown in FIG. 27B. A step S47 calculates the slack S with respect to the wiring L12, and employs the wiring L12 if the slack S calculated for the wiring L12 is smaller than the slack S calculated for the wiring L11. In this case, when the signal delay time from the target v1 to the other target v2 caused by the wiring L12 is denoted by maxDelay(j), and the signal delay time from the target v1 to the other target v2 when the wiring L12 is actually formed is denoted by delay(j), the step S47 determines the Q-pattern which includes the wiring L12 to the other target v2 as the global routing if a relationship maxDelay(j)−delay(j)≧0 is satisfied. As a result, the Q-pattern shown in FIG. 27B is selected in place of the Q-pattern shown in FIG. 27A, and this selected Q-pattern is determined as the global routing.

Accordingly, when a target is connected to another target which is included in a predetermined block which includes the target, and no further target connected to the target exists in a block other than the predetermined block, a buffer is inserted in a wiring from the target to the other target. In addition, if the signal delay time of the wiring to the other target and inserted with the buffer is smaller than that of the original wiring, and a relationship maxDelay(j)−delay(j)≧0 is satisfied, where maxDelay(j) denotes the signal delay time caused by the wiring inserted with the buffer and delay(j) denotes the signal delay time of the wiring which is inserted with the buffer and is actually formed from the target to the other target, the Q-pattern which includes the wiring inserted with the buffer is determined as the global routing.

In each of the embodiments described above, it is described for the sake of convenience that the global routing determination process is carried out with respect to the region which is made up of 2×2 blocks. However, it may be readily seen to those skilled in the art that the global routing determination process can similarly be carried out with respect to a region which is made up of n×m blocks.

In addition, it is possible to arbitrarily combine the embodiments described above. For example, the first and second embodiments may be combined, so as to determine the Q-pattern which satisfies the conditions of both the first and second embodiments as the global routing.

Of course, the present invention can utilize the basic techniques disclosed in Burstein et al., "Hierarchical Wire Routing", IEEE Transactions on Computer-Aided Design, Vol.CAD-2, No.4, October 1983.

Further, the present invention is not limited to these embodiments, but various variations and modifications may be made without departing from the scope of the present invention.

What is claimed is:

1. A global routing determination method which successively divides a region which includes cells forming a circuit into a plurality of blocks, and hierarchically determines a global routing among the cells while arranging the cells in the blocks, comprising the steps of:
   (a) selecting a K-pattern which indicates a position of at least one terminal which is to be coupled by a wiring with respect to a predetermined number of blocks, from a registered K-pattern group;
   (b) reading Q-patterns which indicate wiring patterns with respect to the selected K-pattern, from a registered Q-pattern group; and
   (c) determining, as a global routing, a Q-pattern which has a wiring from a source terminal to a target terminal within the selected K-pattern with a signal delay time satisfying a predetermined condition, from among the read Q-patterns,
   said predetermined condition placing priority on a total wiring length over a density or disorder of wirings among the blocks in which the source terminal and the target terminal exist.

2. The global routing determination method as claimed in claim 1, wherein said step (c) determines, as the global routing, a Q-pattern which minimizes COST(Q) described by a formula $$COST(Q)=COST_{V1}(Q)\times\delta(Q,\ V1)+COST_{V2}(Q)\times\delta(Q,\ V2)+COST_{H1}(Q)\times\delta(Q,\ H1)+COST_{H2}(Q)\times\delta(Q,\ H2)$$

where each read Q-pattern is made up of 2×2 blocks, boundaries x between two mutually adjacent blocks of the read Q-pattern are respectively denoted by V1, V2, H1 and H2, a function δ(Q, x) has a value 1 when a wiring passes through the boundary x and has a value 0 when a wiring does not pass through the boundary x, C1 and C2 are constants, C(x) denotes a number of wirings passing through the boundary x, W(x) denotes a number of wirings which can pass through the boundary, and relationships $$COST_{V1}(Q)=C1^{(C(V1)-W(V1))}+C2$$

$$COST_{V2}(Q)=C1^{(C(V2)-W(V2))}+C2$$

$$COST_{H1}(Q)=C1^{(C(H1)-W(H1))}+C2$$

$$COST_{H2}(Q)=C1^{(C(H2)-W(H2))}+C2$$

stand.

3. A global routing determination method which successively divides a region which includes cells forming a circuit into a plurality of blocks, and hierarchically determines a global routing among the cells while arranging the cells in the blocks, comprising the steps of:

(a) selecting a K-pattern which indicates a position of at least one terminal which is to be coupled by a wiring with respect to a predetermined number of blocks, from a registered K-pattern group;

(b) reading Q-patterns which indicate wiring patterns with respect to the selected K-pattern, from a registered Q-pattern group; and (c) determining, as a global routing, a Q-pattern which has a wiring from a source terminal to a target terminal within the selected K-pattern with a signal delay time satisfying a predetermined condition, from among the read Q-patterns, said step (c) determining, as the global routing, a Q-pattern which minimizes a slack S described by formulas $$S = \sum_{\forall targeti} 0 : maxDelay(i) - delay(i) \geq 0$$

delay(i)−maxDelay(i):maxDelay(i)−delay(i)<0 where maxDelay (i) denotes a signal delay time caused by a wiring from a requested source terminal to a target terminal, and delay(i) denotes a signal delay time which is obtained as a result of actually forming the wiring from the source terminal to the target terminal.

4. The global routing determination method as claimed in claim 3, wherein the signal delay time delay(i) is an Elmore delay described by a formula $$D(v) = rdC_{s0} + \sum_{ev \in path(s0,v)} r_{ev}(C_{ev}/2 + Cv)$$

where a tree T has a source s0, an edge from a node v towards the source s0 is denoted by ev, a resistance of the edge ev is denoted by $r_{ev}$, a capacitance of the edge ev is denoted by $C_{ev}$, a subtree of the node v is denoted by Tv, a capacitance of the subtree Tv is denoted by Cv, an ON-resistance of an output driver of the source s0 is denoted by rd, a sum total of wiring lengths is denoted by $C_{s0}$, and the Elmore delay D(v) indicates a delay from the source s0 to the target v.

5. The global routing determination method as claimed in claim 3, wherein, when the target terminal is connected to another target terminal which is included in a block different from a predetermined block which includes the target terminal, with respect to the Q-patterns satisfying S>0, said step (c) branches a wiring from a block which includes the source terminal to a block other than the predetermined block which includes the target terminal, and if a signal delay time of the branched wiring is smaller than that of an original wiring and a relationship maxDelay(j)−delay(j)≧0 is satisfied, where maxDelay(j) denotes the signal delay time caused by the branched wiring and delay(j) denotes the signal delay time of the branched wiring which is actually formed from the target terminal to the other target terminal, said step (c) determines the Q-pattern which includes the branched wiring as the global routing.

6. The global routing determination method as claimed in claim 5, wherein, when the target terminal is connected to another target terminal which is included in a block different from a predetermined block which includes the target terminal, said step (c) removes a wiring from the target terminal to the other target terminal and forms another wiring which connects to the other target terminal via a path other than the that of the removed wiring, and if a signal delay time of the other wiring is smaller than that of an original wiring, and a relationship maxDelay(k)−delay(k) ≧0 is satisfied, where maxDelay(k) denotes a signal delay time caused by the other wiring and delay(k) denotes a signal delay time of the other wiring which is actually formed from the target terminal to the other target terminal, and said step (c) determines the Q-pattern which includes the other wiring as the global routing.

7. The global routing determination method as claimed in claim 3, wherein, when the target terminal is connected to another target terminal which is included in a predetermined block which includes the target terminal, and no further target terminals connected to the target terminal exist in blocks other than the predetermined block, said step (c) branches a wiring from a block which includes the source terminal into the predetermined block, and if a signal delay time of the branched wiring is smaller than that of an original wiring, and a relationship maxDelay(j)−delay(j)≧0 is satisfied, where maxDelay(j) denotes a signal delay time caused by the branched wiring and delay(j) denotes a signal delay time of the branched wiring which is actually formed from the source terminal to the other target terminal, said step (c) determines the Q-pattern which includes the branched wiring as the global routing.

8. The global routing determination method as claimed in claim 7, wherein, when the target terminal is connected to another target terminal which is included in a predetermined block which includes the target terminal, and a further target terminal connected to the target terminal exists in a block other than the predetermined block, said step (c) removes a wiring from the target terminal to the other target terminal, and forms another wiring which connects to the other target terminal via a path different from that of the removed wiring, and if a signal delay time of the other wiring to the other target terminal is smaller than that of an original wiring, and a relationship maxDelay(k)−delay(k)≧0 is satisfied, where maxDelay(k) denotes a signal delay time caused by the other wiring and delay(k) denotes a signal delay time of the other wiring which is actually formed from the target terminal to the other target terminal, said step (c) determines the Q-pattern which includes the other wiring as the global routing.

9. The global routing determination method as claimed in claim 3, wherein, with respect to the Q-pattern which satisfies the relationship S≧0, when the target terminal is connected to another target terminal which is included in a block other than a predetermined block which includes the target terminal, said step (c) inserts a buffer in a wiring from the target terminal to the other target terminal, and if a signal delay time of the wiring to the other target terminal and inserted with the buffer is smaller than that of an original wiring which does not include the buffer, and a relationship maxDelay(j)−delay(j)≧0 is satisfied, where maxDelay(j) denotes a signal delay time caused by the wiring from the target terminal to the other target terminal and inserted with the buffer and delay(j) denotes a signal delay time of the wiring which is actually formed from the target terminal to the other target terminal and is inserted with the buffer, said step (c) determines the Q-pattern which includes the wiring to the other target terminal and inserted with the buffer as the global routing.

10. The global routing determination method as claimed in claim 3, wherein, when the target terminal is connected to another target terminal which is included in a predetermined block which includes the target terminal, and no further target terminal connected to the target terminal exists in a block other than the predetermined block, said step (c) inserts a buffer in a wiring from the target terminal to the other target terminal, and if a signal delay time of the wiring to the other target terminal and inserted with the buffer is smaller than that of an original wiring, and a relationship maxDelay(j)−delay(j)≧0 is satisfied, where maxDelay(j) denotes a signal delay time caused by the wiring inserted with the buffer and delay(j) denotes a signal delay time of the wiring which is inserted with the buffer and is actually formed from the target terminal to the other target terminal, said step (c) determines the Q-pattern which includes the wiring inserted with the buffer as the global routing.

11. A computer-readable storage medium which stores a program for causing a computer to successively divide a region which includes cells forming a circuit into a plurality of blocks, and to hierarchically determine a global routing among the cells while arranging the cells in the blocks, comprising:

first means for causing the computer to select a K-pattern which indicates a position of at least one terminal which is to be coupled by a wiring with respect to a predetermined number of blocks, from a registered K-pattern group;

second means for causing the computer to read Q-patterns which indicate wiring patterns with respect to the selected K-pattern, from a registered Q-pattern group; and third means for causing the computer to determine, as a global routing, a Q-pattern which has a wiring from a source terminal to a target terminal within the selected K-pattern with a signal delay time satisfying a predetermined condition, from among the read Q-patterns, said predetermined condition placing priority on a total wiring length over a density or disorder of wirings among the blocks in which the source terminal and the target terminal exist.

12. The computer-readable storage medium as claimed in claim 11, wherein said third means causes the computer to determine, as the global routing, a Q-pattern which minimizes COST(Q) described by a formula $$COST(Q)=COST_{V1}(Q) \times \delta(Q, V1) + COST_{V2}(Q) \times \delta(Q, V2) + COST_{H1}(Q) \times \delta(Q, H1) + COST_{H2}(Q) \times \delta(Q, H2)$$

where each read Q-pattern is made up of 2×2 blocks, boundaries x between two mutually adjacent blocks of the read Q-pattern are respectively denoted by V1, V2, H1 and H2, a function δ(Q, x) has a value 1 when a wiring passes through the boundary x and has a value 0 when a wiring does not pass through the boundary x, C1 and C2 are constants, C(x) denotes a number of wirings passing through the boundary x, W(x) denotes a number of wirings which can pass through the boundary, and relationships $$COST_{V1}(Q)=C1^{(C(V1)-W(V1))}+C2$$
$$COST_{V2}(Q)=C1^{(C(V2)-W(V2))}+C2$$
$$COST_{H1}(Q)=C1^{(C(H1)-W(H1))}+C2$$
$$COST_{H2}(Q)=C1^{(C(H2)-W(H2))}+C2$$

stand.

13. A computer-readable storage medium which stores a program for causing a computer to successively divide a region which includes cells forming a circuit into a plurality of blocks, and to hierarchically determine a global routing among the cells while arranging the cells in the blocks, comprising:

first means for causing the computer to select a K-pattern which indicates a position of at least one terminal which is to be coupled by a wiring with respect to a predetermined number of blocks, from a registered K-pattern group;

second means for causing the computer to read Q-patterns which indicate wiring patterns with respect to the selected K-pattern, from a registered Q-pattern group; and third means for causing the computer to determine, as a global routing, a Q-pattern which has a wiring from a source terminal to a target terminal within the selected K-pattern with a signal delay time satisfying a predetermined condition, from among the read Q-patterns, said third means determining, as the global routing, a Q-pattern which minimizes a slack S described by formulas $$S = \sum_{\forall target i} 0 : maxDelay(i) - delay(i) \geq 0$$

$$delay(i) - maxDelay(i) : maxDelay(i) - delay(i) < 0$$

where maxDelay (i) denotes a signal delay time caused by a wiring from a requested source terminal to a target terminal, and delay(i) denotes a signal delay time which is obtained as a result of actually forming the wiring from the source terminal to the target terminal.

14. The computer-readable storage medium as claimed in claim 13, wherein the signal delay time delay(i) is an Elmore delay described by a formula $$D(v) = rdC_{s0} + \sum_{ev \in path(s0,v)} r_{ev}(C_{ev}/2 + Cv)$$

where a tree T has a source s0, an edge from a node v towards the source s0 is denoted by ev, a resistance of the edge ev is denoted by $r_{ev}$, a capacitance of the edge ev is denoted by $C_{ev}$, a subtree of the node v is denoted by Tv, a capacitance of the subtree Tv is denoted by Cv, an ON-resistance of an output driver of the source s0 is denoted by rd, a sum total of wiring lengths is denoted by $C_{s0}$, and the Elmore delay D(v) indicates a delay from the source s0 to the target v.

* * * * *